US008996940B2

(12) United States Patent
Nomura et al.

(10) Patent No.: US 8,996,940 B2
(45) Date of Patent: Mar. 31, 2015

(54) SEMICONDUCTOR INTEGRATED CIRCUIT AND POWER-SUPPLY VOLTAGE ADAPTIVE CONTROL SYSTEM

(75) Inventors: Masahiro Nomura, Kanagawa (JP); Taro Sakurabayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 237 days.

(21) Appl. No.: 13/349,279

(22) Filed: Jan. 12, 2012

(65) Prior Publication Data

US 2012/0182047 A1 Jul. 19, 2012

(30) Foreign Application Priority Data

Jan. 13, 2011 (JP) .................................. 2011-004548

(51) Int. Cl.
*G01R 31/28* (2006.01)
*H03K 3/037* (2006.01)
(Continued)

(52) U.S. Cl.
CPC ...... *H03K 3/0375* (2013.01); *G01R 31/318575* (2013.01); *H03K 19/0008* (2013.01); *H03K 19/0016* (2013.01)
USPC ............ 714/726; 714/727; 714/729; 714/733

(58) Field of Classification Search
CPC ............... G01R 31/318575; G01R 31/318536; G01R 31/318583; G01R 31/318569; G01R 31/318566; H03K 19/0016; H03K 19/0008; H03K 3/0375
USPC .................................. 714/726, 727, 729, 733
See application file for complete search history.

(56) References Cited

U.S. PATENT DOCUMENTS 6,463,561 B1 * 10/2002 Bhawmik et al. ............. 714/733
6,515,549 B2    2/2003 Nakano
6,578,166 B1 *  6/2003 Williams ...................... 714/726
(Continued)

FOREIGN PATENT DOCUMENTS

JP        1-119776 A    5/1989
JP    2001-242223 A    9/2001
(Continued)

OTHER PUBLICATIONS

Uthman Alsaiari et al., Partitioning for Selective Flip-Flop Redundancy in Sequential Circuits, IEEE, 9th International Symposium on Quality Electronic Design, 2008, pp. 798-803.
(Continued)

Primary Examiner — Cynthia Britt
(74) Attorney, Agent, or Firm — Foley & Lardner LLP

(57) ABSTRACT

A semiconductor integrated circuit has: N input terminals; N output terminals; a plurality of flip-flops including N flip-flops and R redundant flip-flops; a selector section configured to select N selected flip-flops from the plurality of flip-flops depending on reconfiguration information and to switch data flow such that data input to the N input terminals are respectively output to the N output terminals by the N selected flip-flops; and an error detection section. At a test mode, the N flip-flops form a scan chain and a scan data is input to the scan chain. The error detection section detects an error flip-flop included in the N flip-flops based on scan input/output data respectively input/output to/from the N flip-flops at the test mode and further generates the reconfiguration information such that the detected error flip-flop is excluded from the N selected flip-flops.

4 Claims, 28 Drawing Sheets

(51) Int. Cl.
*G01R 31/3185* (2006.01)
*H03K 19/00* (2006.01)

(56) References Cited

U.S. PATENT DOCUMENTS

| | | | |
|---|---|---|---|
| 7,076,707 B2* | 7/2006 | Lee et al. | 714/726 |
| 7,139,948 B2* | 11/2006 | Rearick et al. | 714/726 |
| 7,139,950 B2* | 11/2006 | Huisman et al. | 714/726 |
| 7,171,592 B2 | 1/2007 | Togashi et al. | |
| 7,480,844 B2* | 1/2009 | Sakuma et al. | 714/726 |
| 7,734,974 B2* | 6/2010 | Aitken et al. | 714/729 |
| 7,895,487 B2* | 2/2011 | Huisman et al. | 714/726 |
| 7,908,532 B2* | 3/2011 | Eckelman et al. | 714/726 |
| 7,945,829 B2* | 5/2011 | Nanba et al. | 714/726 |
| 8,356,218 B2* | 1/2013 | Funatsu | 714/726 |
| 8,402,328 B2* | 3/2013 | Wang et al. | 714/726 |
| 8,645,778 B2* | 2/2014 | Tekumalla et al. | 714/726 |

FOREIGN PATENT DOCUMENTS

| | | |
|---|---|---|
| JP | 2003-272400 A | 9/2003 |
| JP | 2007-096918 A | 4/2007 |
| JP | 2008-244003 A | 10/2008 |

OTHER PUBLICATIONS

Masanori Kurimoto et al., A Yield Improvement Methodology Based on Logic Redundant Repair with a Repairable Scan Flip-Flop Designed by Push Rule, IEEE, 11$^{th}$ Int'l Symposium on Quality Electronic Design, 2010, 7 pages.

* cited by examiner

Fig. 7

| | Reset | DC-Test | |
|---|---|---|---|
| SLi[0]<br>SLo[0] | 0<br>1 | 0<br>1 | |
| SLi[1]<br>SLo[1] | 0<br>1 | 0<br>1 | |
| SLi[2]<br>SLo[2] | 0<br>1 | 0<br>1 | |
| SLi[3]<br>SLo[3] | 0 ⟶<br>1 ⟶ | 1<br>0 | RECON |
| SLi[4]<br>SLo[4] | 0 ⟶<br>1 ⟶ | 1<br>0 | |
| SLi[5]<br>SLo[5] | 0 ⟶<br>1 ⟶ | 1<br>0 | |
| SLi[6]<br>SLo[6] | 0 ⟶<br>1 ⟶ | 1<br>0 | |
| SLi[7], [8]<br>SLo[7] | 0 ⟶<br>1 ⟶ | 1<br>0 | |
| LB | 0 ⟶ | 1 | |

Fig. 22

| | Reset | AC-Test | |
|---|---|---|---|
| SLi[0]<br>SLo[0] | 0<br>1 | 0<br>1 | RECON |
| SLi[1]<br>SLo[1] | 0<br>1 | 0<br>1 | |
| SLi[2]<br>SLo[2] | 0<br>1 | 0<br>1 | |
| SLi[3]<br>SLo[3] | 0 ⟶<br>1 ⟶ | 1<br>0 | |
| SLi[4]<br>SLo[4] | 0 ⟶<br>1 ⟶ | 1<br>0 | |
| SLi[5]<br>SLo[5] | 0 ⟶<br>1 ⟶ | 1<br>0 | |
| SLi[6]<br>SLo[6] | 0 ⟶<br>1 ⟶ | 1<br>0 | |
| SLi[7], [8]<br>SLo[7] | 0 ⟶<br>1 ⟶ | 1<br>0 | |

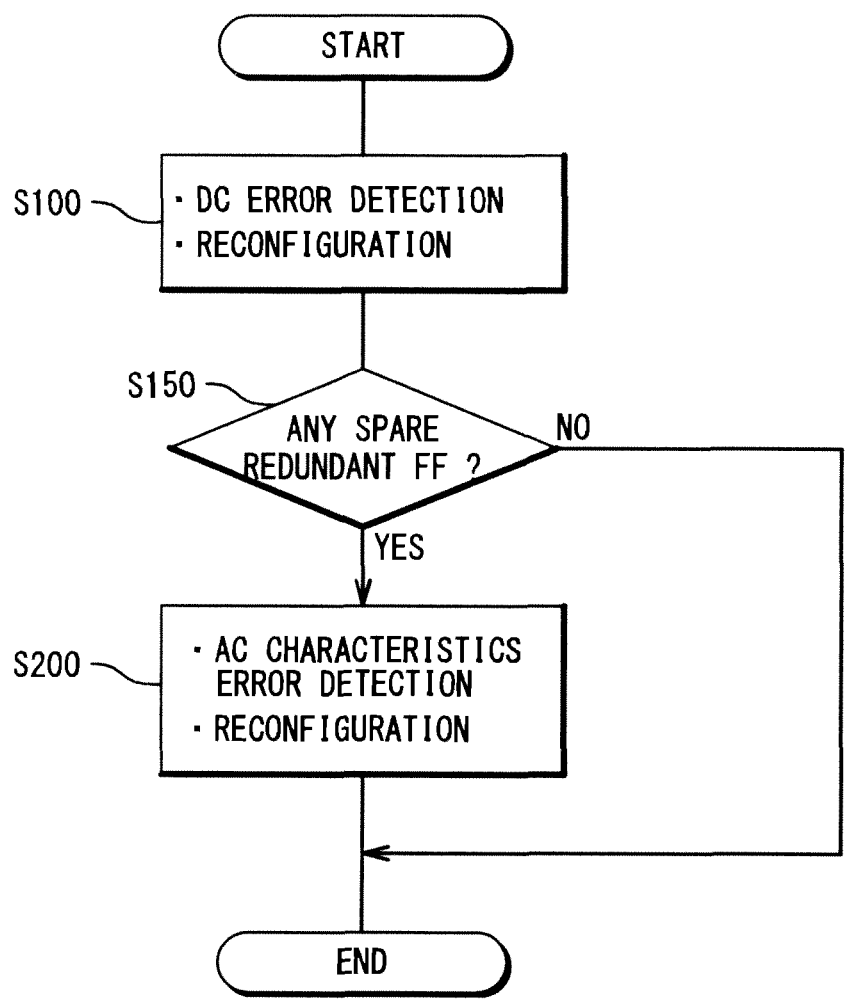

SEMICONDUCTOR INTEGRATED CIRCUIT AND POWER-SUPPLY VOLTAGE ADAPTIVE CONTROL SYSTEM

INCORPORATION BY REFERENCE

This application is based upon and claims the benefit of priority from Japanese patent application No. 2011-004548, filed on Jan. 13, 2011, the disclosure of which is incorporated herein in its entirety by reference.

BACKGROUND OF THE INVENTION

1. Field of the Invention

The present invention relates to a semiconductor integrated circuit and a power-supply voltage adaptive control system. In particular, the present invention relates to a semiconductor integrated circuit having a flip-flop performing a low voltage operation and a power-supply voltage adaptive control system.

2. Description of Related Art

In recent years, the amount of development in an "extremely low power circuit" as a measure against global warming has been increasing. The extremely low power circuit is a semiconductor integrated circuit operating with an extremely low voltage about 0.5 V, with which power consumption can be greatly reduced. However, to reduce the operation voltage of the semiconductor integrated circuit causes several problems.

For example, when an operation voltage of a logic circuit is reduced, malfunction of a flip-flop included in the logic circuit may be caused. More specifically, the reduction in the operation voltage may cause "DC error" where an output value of the flip-flop is fixed to "0" or "1". Also, the reduction in the operation voltage may cause "AC characteristics error" where AC characteristics such as latch characteristics and delay characteristics of the flip-flop become inadequate.

In a case where such the DC error and AC characteristics error occur randomly at a low frequency, "redundancy technique" is effective. More specifically, a redundant flip-flop is provided in a logic circuit and an error flip-flop where the DC error or the AC characteristics error occurs is replaced by the redundant flip-flop. Such the redundancy technique for flip-flop is disclosed, for example, in Non-Patent Literature 1 and Non-Patent Literature 2.

CITATION LIST

Non-Patent Literature

[Non-Patent Literature 1] U. Alsaiari and R. Saleh, "Partitioning for Selective Flip-Flop Redundancy in Sequential Circuits", pp. 798-803, 9th International Symposium on Quality Electronic Design (ISQED), 2008.
[Non-Patent Literature 2] M. Kurimoto et al., "A Yield Improvement Methodology Based on Logic Redundant Repair with a Repairable Scan Flip-Flop Designed by Push Rule", pp. 184-190, 11th International Symposium on Quality Electronic Design (ISQED), 2010.

SUMMARY

With regard to a semiconductor integrated circuit having a flip-flop, a technique is desired that can efficiently detect an error flip-flop where DC error or AC characteristics error is occurring.

In an aspect of the present invention, a semiconductor integrated circuit is provided. The semiconductor integrated circuit has: N input terminals, wherein N is an integer equal to or more than 1; N output terminals; a plurality of flip-flops including N flip-flops and R redundant flip-flops, wherein R is an integer equal to or more than 1; a selector section; and an error detection section. The selector section is configured to select N selected flip-flops from the plurality of flip-flops depending on reconfiguration information and to switch data flow such that data input to the N input terminals are respectively output to the N output terminals by the N selected flip-flops. The error detection section is configured to generate the reconfiguration information at a test mode. More specifically, at the test mode, the N flip-flops form a scan chain and a scan data is input to the scan chain. A flip-flop whose output is fixed to 0 or 1 is an error flip-flop. The error detection section detects the error flip-flop included in the N flip-flops based on scan input data respectively input to the N flip-flops and scan output data respectively output from the N flip-flops at the test mode. Furthermore, the error detection section generates the reconfiguration information such that the detected error flip-flop is excluded from the N selected flip-flops.

In another aspect of the present invention, a semiconductor integrated circuit is provided. The semiconductor integrated circuit has a plurality of flip-flops and a counter. Each of the plurality of flip-flops has a feedback path from its own output to input and is configured to perform a toggle operation or a self-oscillation operation by using the feedback path at a test mode. At the test mode, the counter receives an output data from each flip-flop performing the toggle operation or the self-oscillation operation and performs counting with regard to the output data for a predetermined period of time.

In still another aspect of the present invention, a power-supply voltage adaptive control system is provided. The power-supply voltage adaptive control system has: the above-mentioned semiconductor integrated circuit; a power-supply circuit configured to supply an operation voltage of the plurality of flip-flops; and a control circuit configured to control operations of the semiconductor integrated circuit and the power-supply circuit. If the error flip-flop still remains even when the R redundant flip-flops are used, the control circuit instructs the power-supply circuit to increase the operation voltage.

According to the present invention, it is possible with regard to a semiconductor integrated circuit having a flip-flop to efficiently detect an error flip-flop where DC error or AC characteristics error is occurring.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 7 is a conceptual diagram showing an example of reconfiguration information in the first embodiment of the present invention;

FIG. 22 is a conceptual diagram showing an example of reconfiguration information in the second embodiment of the present invention;

FIG. 28 is a flow chart showing processing in a third embodiment of the present invention.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described with reference to the attached drawings.

1. First Embodiment

DC Error Detection and Reconfiguration

1-1. Outline

According to a first embodiment of the present invention, "DC error" where an output value of a flip-flop is fixed to "0" or "1" is detected efficiently. Furthermore, "reconfiguration processing" that replaces an error flip-flop where the DC error occurs with a redundant flip-flop is performed.

Figure 1:
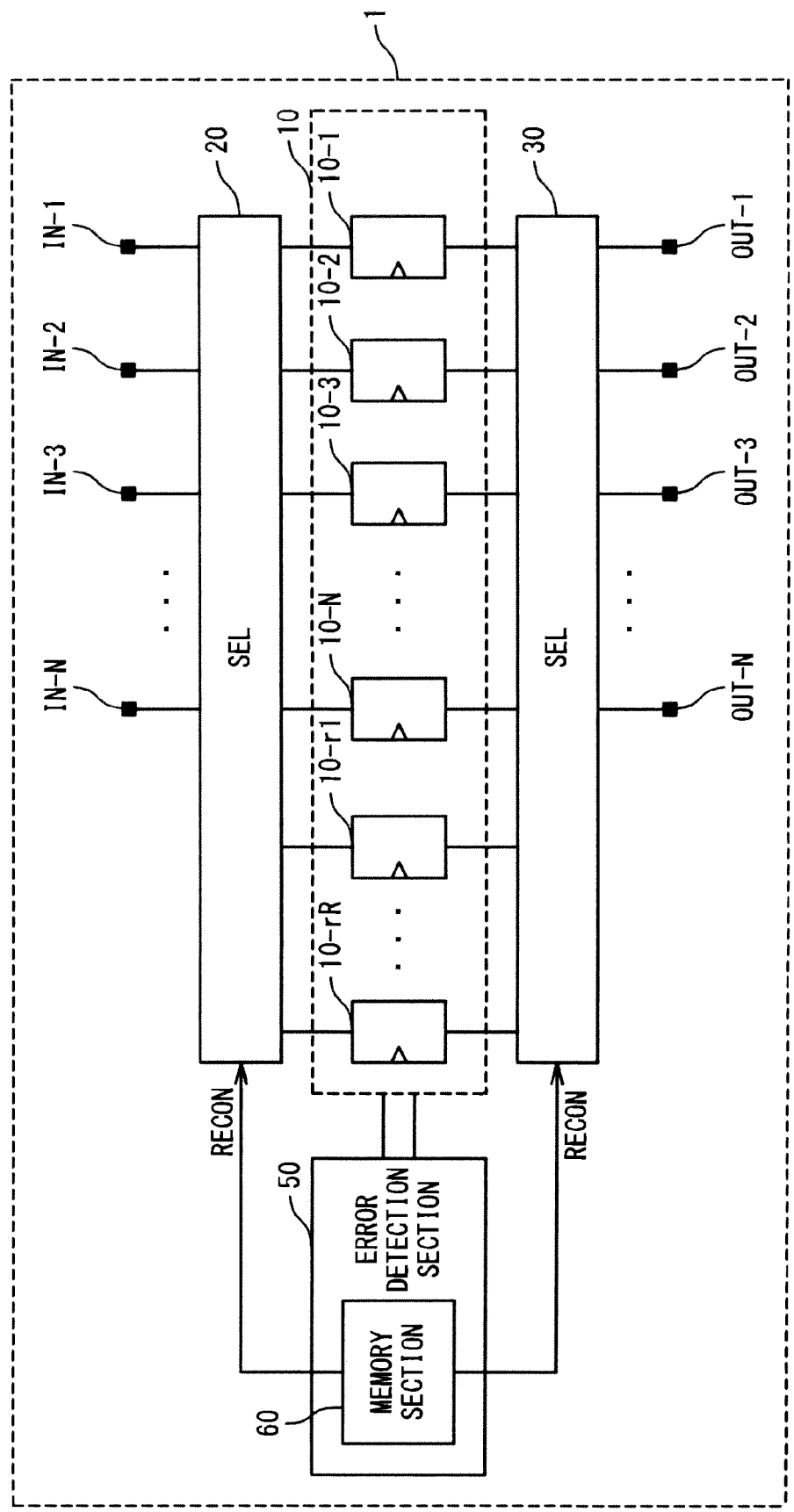
FIG. 1 is a block diagram schematically showing a configuration of a semiconductor integrated circuit according to a first embodiment of the present invention.

FIG. 1 is a block diagram schematically showing a configuration of a semiconductor integrated circuit according to the first embodiment. The semiconductor integrated circuit according to the present embodiment has a multi-bit register section 1 that stores plural bit data. The multi-bit register section 1 has N input terminals IN-1 to IN-N (N is an integer equal to or more than 1) and N output terminals OUT-1 to OUT-N. The multi-bit register section 1 stores N-bit data respectively input to the input terminals IN-1 to IN-N and outputs the N-bit data respectively from the output terminals OUT-1 to OUT-N.

More specifically, the multi-bit register section 1 has a plurality of flip-flops 10 for storing the N-bit data. Each flip-flop 10 is a D flip-flop, for example. In the present embodiment, the plurality of flip-flops 10 include at least one redundant flip-flop. That is, the plurality of flip-flops 10 include N flip-flops 10-1 to 10-N and R redundant flip-flops 10-r1 to 10-rR. Here, R being an integer equal to or more than 1 represents "redundancy". Then, "N selected flip-flops" among the N+R flip-flops 10 are used for storing the N-bit data input to the input terminals IN-1 to IN-N.

It is reconfiguration information RECON and a selector section (20, 30) that is used for selecting the N selected flip-flops. The reconfiguration information RECON is a data that specifies the N selected flip-flops. The selector section (20, 30) selects the N selected flip-flops from the plurality of flip-flops 10 depending on the reconfiguration information RECON. Then, the selector section (20, 30) switches data flow such that the N-bit data input to the N input terminals IN-1 to IN-N are respectively output to the N output terminals OUT-1 to OUT-N by the N selected flip-flops.

More specifically, the multi-bit register section 1 has an input selector section 20 and an output selector section 30, as shown in FIG. 1.

The input selector section 20 is provided between the N input terminals IN-1 to IN-N and the N+R flip-flops 10. The input selector section 20 switches, depending on the reconfiguration information RECON, a connection relationship between the N input terminals IN-1 to IN-N and the N+R flip-flops 10. More specifically, the input selector section 20 sets up the connection relationship based on the reconfiguration information RECON such that the N-bit data input to the N input terminals IN-1 to IN-N are supplied to the N selected flip-flops.

The output selector section 30 is provided between the N+R flip-flops 10 and the N output terminals OUT-1 to OUT-N. The output selector section 30 switches, depending on the reconfiguration information RECON, a connection relationship between the N output terminals OUT-1 to OUT-N and the N+R flip-flops 10. More specifically, the output selector section 30 sets up the connection relationship based on the reconfiguration information RECON such that the N-bit data output from the N selected flip-flops are output to the N output terminals OUT-1 to OUT-N.

In the present embodiment, the multi-bit register section 1 further has an "error detection section 50". The error detection section 50 is connected to a data input terminal and a data output terminal of each flip-flop 10. At a DC test mode, the error detection section 50 detects an error flip-flop where the DC error is occurring based on input and output of each flip-flop 10. Furthermore, the error detection section 50 generates the reconfiguration information RECON such that the detected error flip-flop is excluded from the N selected flip-flops.

Figure 2:
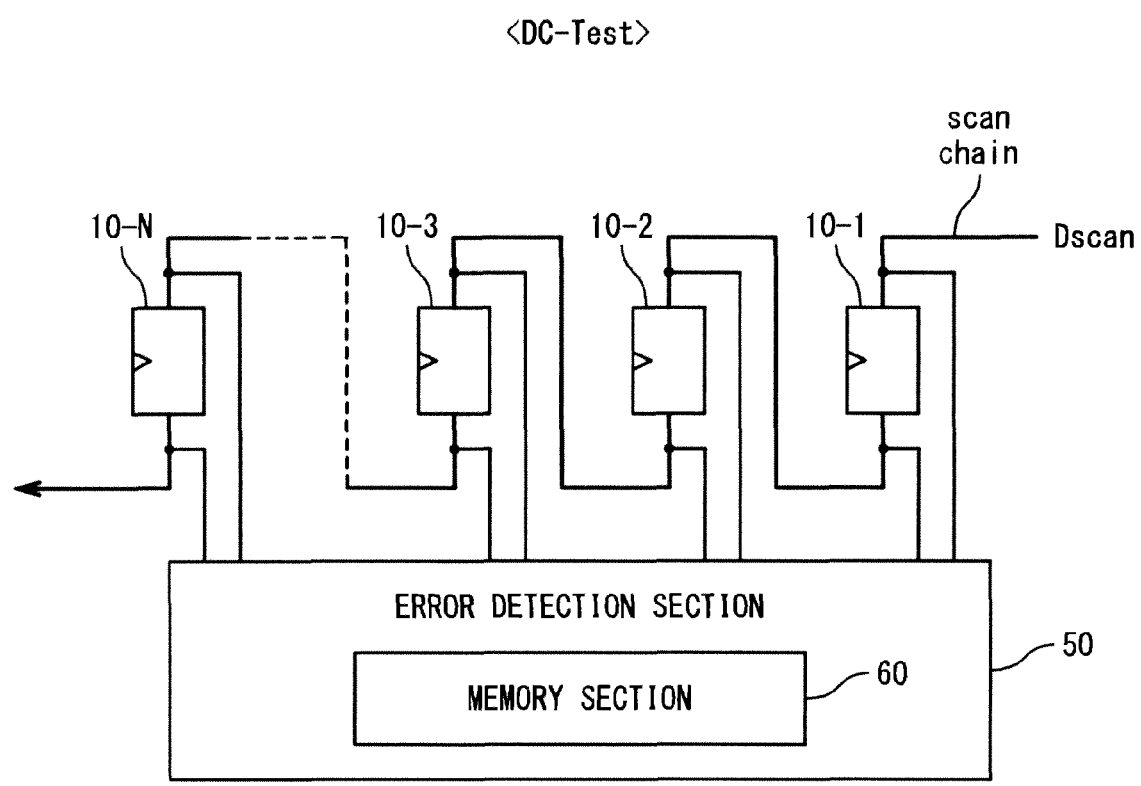
FIG. 2 is a block diagram schematically showing a configuration at a DC test in the first embodiment of the present invention.

FIG. 2 shows in detail a configuration at the DC test. Note that description of the selector section (20, 30) is omitted in FIG. 2. According to the present embodiment, the N flip-flops 10-1 to 10-N form a scan chain at the DC test mode. A scan data Dscan is sequentially input to the scan chain. The error detection section 50 is connected to a data input terminal and a data output terminal of each flip-flop 10 and detects occurrence of the DC error based on scan input data input to the respective flip-flops 10 and scan output data output from the respective flip-flops 10. That is, the error detection section 50 detects whether or not an error flip-flop is included in the N flip-flops 10-1 to 10-N and, if included, detects a position of the error flip-flop. If the number of error flip-flops detected is equal to or less than the "redundancy R", it is possible to replace the error flip-flop with the redundant flip-flop 10-$r$. The error detection section 50 generates the reconfiguration information RECON such that the redundant flip-flop 10-$r$ instead of the detected error flip-flop is incorporated into the selected flip-flops. In other words, the error detection section 50 generates the reconfiguration information RECON such that the detected error flip-flop is excluded from the N selected flip-flops.

The error detection section 50 stores the generated reconfiguration information RECON in a memory section 60. Preferably, the memory section 60 is prepared with respect to each multi-bit register section 1. For example, the memory section 60 is comprised of a latch circuit in the error detection section 50. However, the configuration of the memory section 60 is not limited to that. The memory section 60 may be a memory macro such as a flash memory that is shared by a plurality of multi-bit register sections 1.

The reconfiguration information RECON stored in the memory section 60 is output to (reflected in) the selector section 20, 30 at a predetermined timing after the DC test mode is ended. As a result, the error flip-flop detected at the DC test is excluded from the N selected flip-flops, and instead, the redundant flip-flop 10-$r$ is appropriately incorporated into the selected flip-flops. This processing is the "reconfiguration processing".

Figure 3:
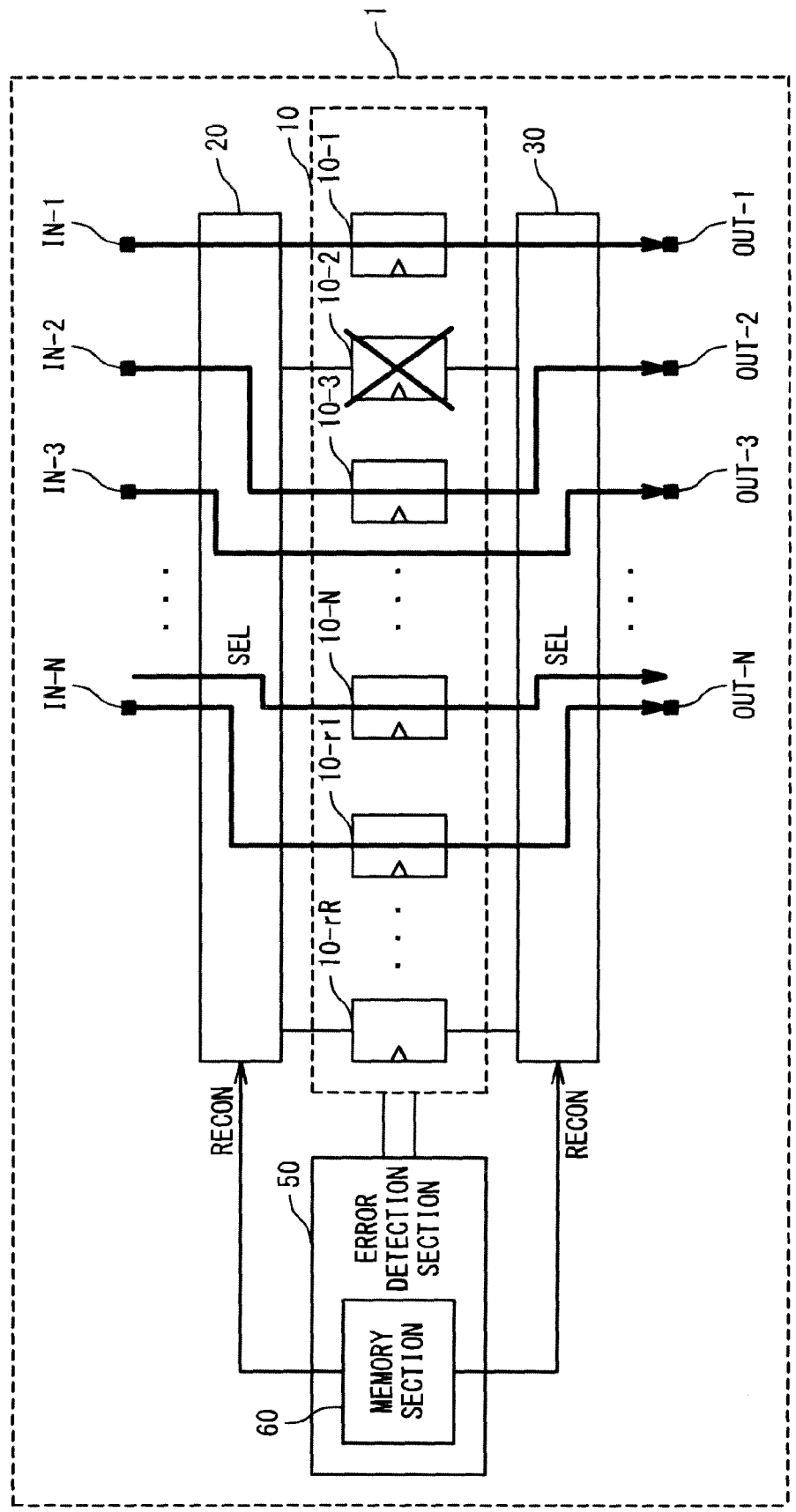
FIG. 3 is a block diagram schematically showing reconfiguration processing in the first embodiment of the present invention.

FIG. 3 schematically shows an example of the reconfiguration processing in the present embodiment. For example, let us consider a case where a flip-flop 10-2 is detected as an error flip-flop as a result of the above-described DC test. In this case, the selector section (20, 30) switches the data flow so as to bypass the error flip-flop 10-2, in accordance with the reconfiguration information RECON. More specifically, a redundant flip-flop 10-$r1$ instead of the error flip-flop 10-2 is incorporated into the selected flip-flops. The input selector section 20 electrically connects the N input terminals IN-1 to IN-N and the N selected flip-flops 10-1, 10-3 to 10-N and 10-$r1$, respectively. The output selector section 30 electrically connects the N selected flip-flops 10-1, 10-3 to 10-N and 10-$r1$ and the N output terminals OUT-1 to OUT-N, respectively. Consequently, the N-bit data input to the N input terminals IN-1 to IN-N are respectively output to the N output terminals OUT-1 to OUT-N without through the error flip-flop 10-2.

According to the present embodiment, as described above, a position of the error flip-flop (position of the DC error occurrence) can be detected "efficiently" by the use of the scan chain. As a result, a time required for the DC test is reduced. Moreover, according to the present embodiment, the multi-bit register section 1 has the error detection section 50, and at the DC test mode, the multi-bit register section 1 itself generates the reconfiguration information RECON. This enables the efficient reconfiguration processing.

1-2. Concrete Example

1-2-1. Circuit Configuration Example

Figure 4:
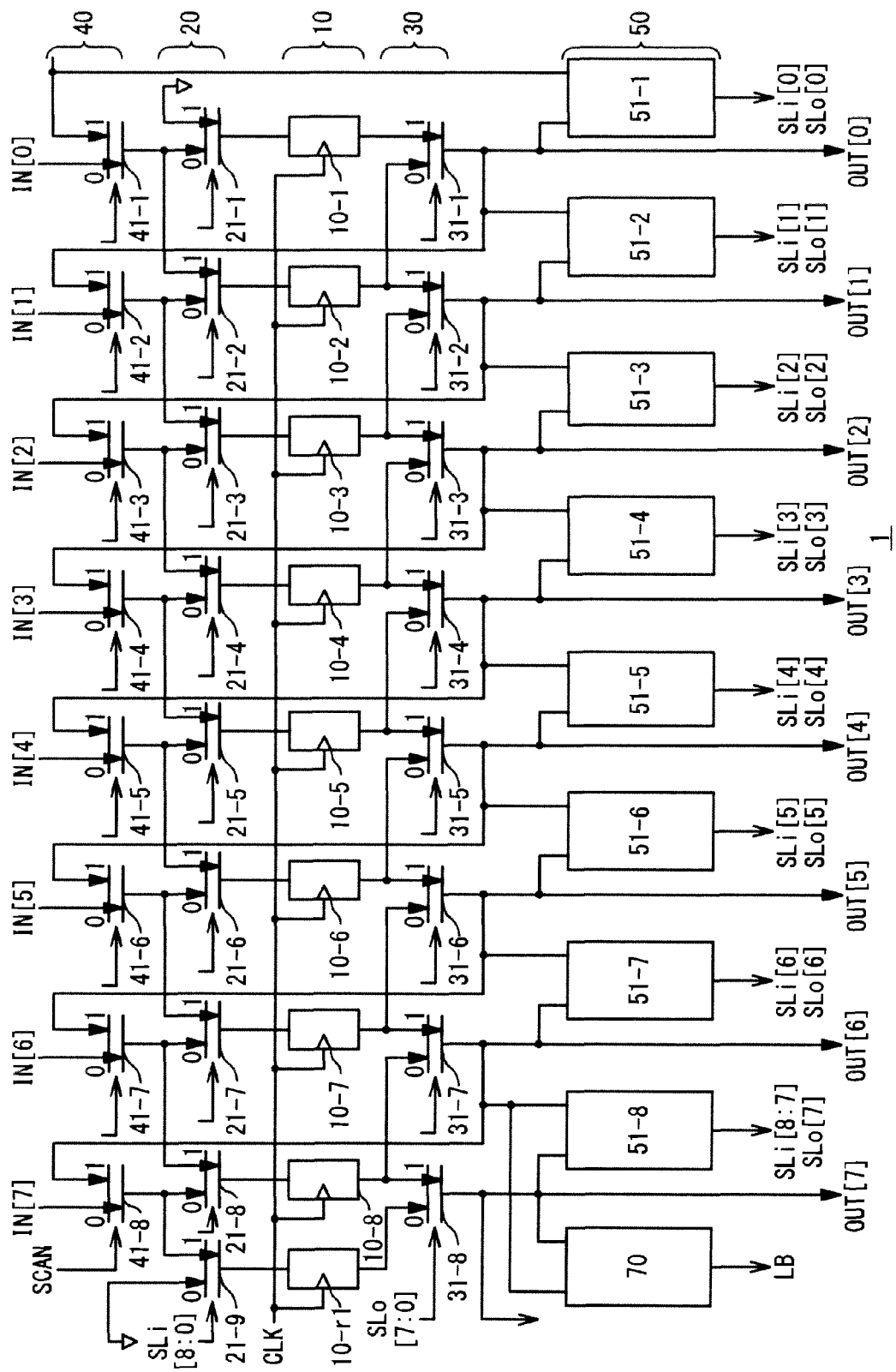
FIG. 4 is a circuit diagram showing a configuration example of the semiconductor integrated circuit according to the first embodiment of the present invention.

FIG. 4 shows an example of a circuit configuration of the multi-bit register section 1 of the semiconductor integrated circuit according to the present embodiment. In the present example, let us consider a case where N=8 and the redundancy R=1. 8-bit input data IN[7:0] are respectively input to the input terminals IN-8 to IN-1 of the multi-bit register section 1. 8-bit output data OUT[7:0] are respectively output from the output terminals OUT-8 to OUT-1 of the multi-bit register section 1. As shown in FIG. 4, the multi-bit register section 1 has the plurality of flip-flops 10 (10-1 to 10-8, 10-$r1$), the input selector section 20, the output selector section 30, a scan selector section 40, the error detection section 50 and a line determination circuit 70.

A clock signal CLK is input to a clock terminal of each flip-flop 10. Each flip-flop 10 operates based on the clock signal CLK.

The input selector section 20 has N+1 input selectors 21-1 to 21-9. The input selector 21-$k$ ($k$=1 to 8) selects, depending on an input select signal SLi[k−1], either an output data from a scan selector 41-$k$ or an output data from a lower-bit side scan selector 41-($k$−1) and outputs the selected data to the data input terminal of the flip-flop 10-$k$. It should be noted that, in the case of the input selector 21-1, the output data from the lower-bit side is a fixed data. The input selector 21-9 selects, depending on an input select signal SLi[8], either a fixed data or an output data from a scan selector 41-8 and outputs the selected data to the data input terminal of the redundant flip-flop 10-$r1$. The 9-bit input select signals SLi[8:0] correspond to the reconfiguration information RECON.

The output selector section 30 has N output selectors 31-1 to 31-8. The output selector 31-$k$ ($k$=1 to 8) selects, depending on an output select signal SLo[k−1], either an output data from the flip-flop 10-$k$ or an output data from the upper-bit side flip-flop 10-($k$+1) and outputs the selected data as the output data OUT[k−1]. It should be noted that, in the case of the output selector 31-8, the upper-bit side flip-flop is the redundant flip-flop 10-$r1$. The 8-bit output select signal SLo[7:0] correspond to the reconfiguration information RECON.

The scan selector section 40 has N scan selectors 41-1 to 41-8. The scan selector 41-$k$ ($k$=1 to 8) selects, depending on a scan signal SCAN, either the input data IN[k−1] or the output data OUT[k−2] from the lower-bit side output selector 31-($k$−1) and outputs the selected data to both of the input selector 21-$k$ and the upper-bit side input selector 21-($k$+1). It should be noted that, in the case of the scan selector 41-1, the scan data Dscan is input instead of the lower-bit side output data OUT[k−2] (will be described later).

The error detection section 50 has N error detection/memory circuits 51-1 to 51-8. At the DC test mode, the error detection/memory circuit 51-$k$ ($k$=1 to 8) receives the input data (scan input data Din) to the scan selector 41-$k$ and the output data (scan output data Dout) from the output selector 31-$k$. Then, the error detection/memory circuit 51-$k$ generates the input select signal SLi[k−1] and the output select signal SLo[k−1] based on the scan input data Din and the scan output data Dout and stores them. It should be noted that the error detection/memory circuit 51-8 sets the input select signal SLi[8] to the same value as the input select signal SLi[7].

Figure 5:
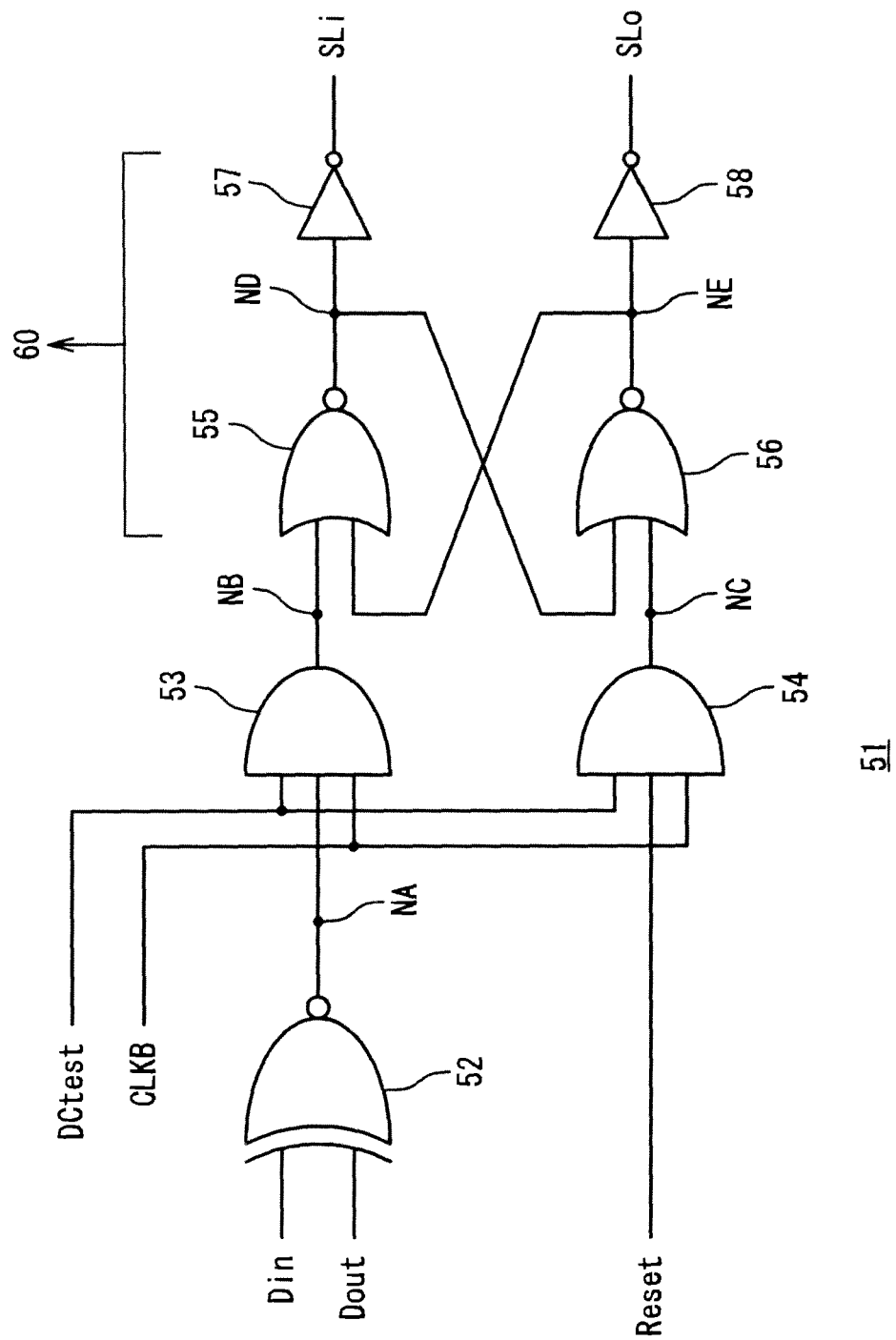
FIG. 5 is a circuit diagram showing a configuration example of an error detection/memory circuit in the first embodiment of the present invention.

FIG. 5 shows an example of a circuit configuration of one error detection/memory circuit 51. The error detection/memory circuit 51 has an EXNOR circuit 52, AND circuits 53, 54, NOR circuits 55, 56 and inverter circuits 57, 58.

The scan input data Din and the scan output data Dout are input to input terminals of the EXNOR circuit 52. An output terminal of the EXNOR circuit 52 is connected to a node NA. A DC test signal DCtest, an inverted clock signal CLKB and an output signal from the EXNOR circuit 52 (i.e. a signal at node NA) are input to input terminals of the AND circuit 53. An output terminal of the AND circuit 53 is connected to a node NB. The DC test signal DCtest, the inverted clock signal CLKB and a reset signal Reset are input to input terminals of the AND circuit 54. An output terminal of the AND circuit 54 is connected to a node NC.

The NOR circuits 55 and 56 form an RS latch circuit. More specifically, input terminals of the NOR circuit 55 are connected to nodes NB and NE, and an output terminal thereof is connected to a node ND. Input terminals of the NOR circuit 56 are connected to nodes NC and ND, and an output terminal thereof is connected to the node NE. An input terminal of the inverter circuit 57 is connected to the node ND, and the input select signal SLi is output from an output terminal thereof. An input terminal of the inverter circuit 58 is connected to the node NE, and the output select signal SLo is output from an output terminal thereof. It should be noted that the NOR circuits 55, 56 and the inverter circuits 57, 58 correspond to the "memory section 60" that stores the reconfiguration information RECON (input select signal SLi, output select signal SLo). Details of an operation of the error detection/memory circuit 51 will be described later.

Referring back to FIG. 4 again, the line determination circuit 70 receives the input data (scan input data Din) to the scan selector 41-8 and the output data (scan output data Dout) from the output selector 31-8, at the DC test mode. Then, the line determination circuit 70 generates a line determination bit LB based on the scan input data Din and the scan output data Dout and stores them. The line determination bit LB is an error flag indicating whether or not any error flip-flop is included in the N flip-flops 10-1 to 10-8.

Figure 6:
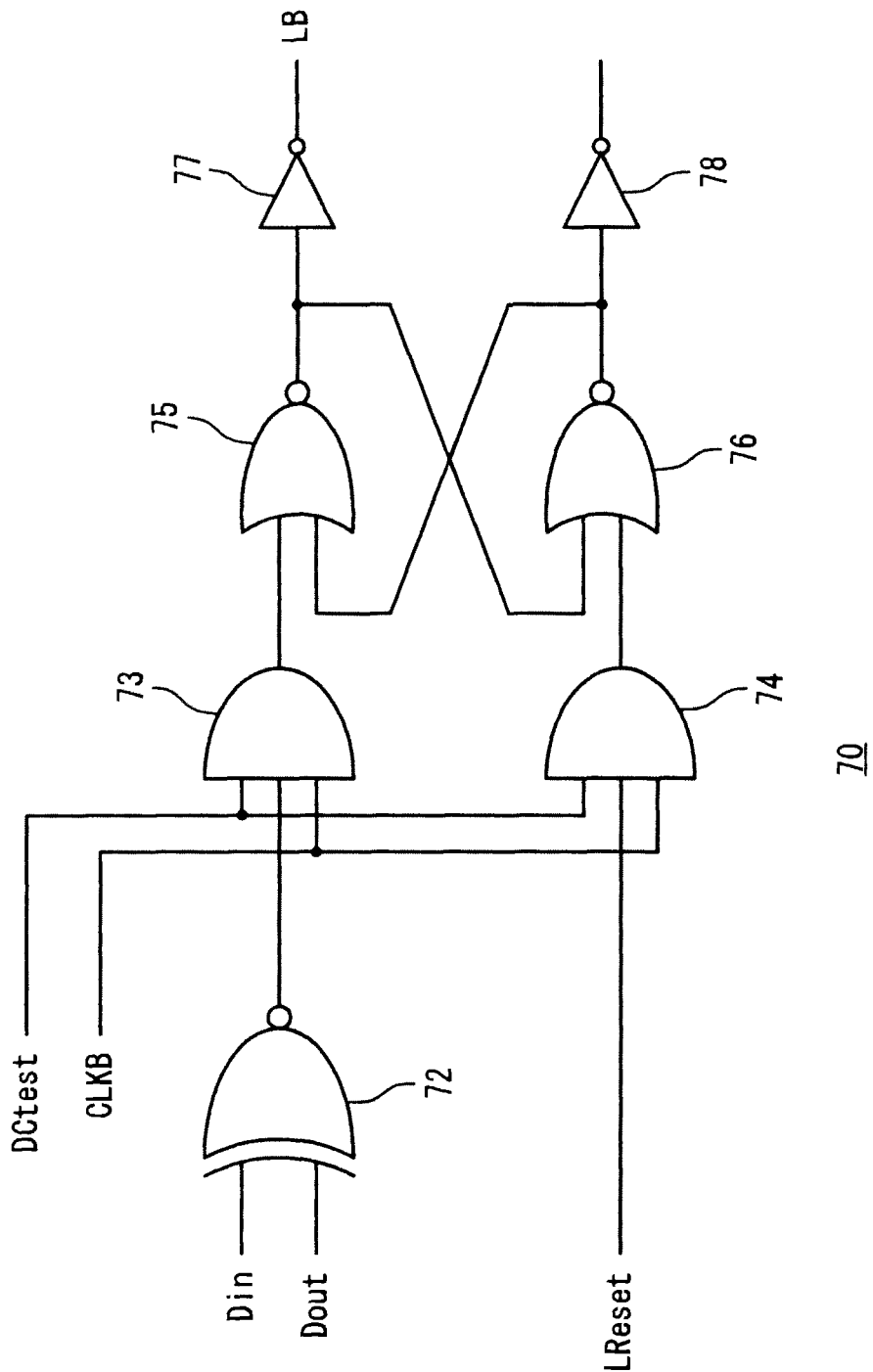
FIG. 6 is a circuit diagram showing a configuration example of a line determination circuit in the first embodiment of the present invention.

FIG. 6 shows an example of a circuit configuration of the line determination circuit 70. The circuit configuration of the line determination circuit 70 is similar to the circuit configuration of the error detection/memory circuit 51 shown in FIG. 5. The EXNOR circuit 52, the AND circuits 53, 54, the NOR circuits 55, 56 and the inverter circuits 57, 58 are replaced with an EXNOR circuit 72, AND circuits 73, 74, NOR circuits 75, 76 and inverter circuits 77, 78, respectively. Also, a line reset signal LReset instead of the reset signal Reset is input, and the line determination bit LB instead of the input select signal SLi is output. It should be noted that a single EXNOR circuit may be used in common as the EXNOR circuit 52 of the error detection/memory circuit 51-8 and the EXNOR circuit 72 of the line determination circuit 70. Details of an operation of the line determination circuit 70 will be described later.

1-2-2. Operation Example

An operation at the DC test mode will be described in detail. At the DC test mode, the DC test signal DCtest is set to "1" and the scan signal SCAN is set to "1".

First, reset processing is performed. More specifically, the reset signal Reset is set to "1" for a predetermined period of time in all the error detection/memory circuits 51. As a result, the RS latch circuit (see FIG. 5) comprised of the NOR circuits 55 and 56 is reset and thus the input select signal SLi becomes "0" and the output select signal SLo becomes "1". Also, reset processing is similarly performed with respect to the line determination circuit 70. The line reset signal LReset is set to "1" for a predetermined period of time and thus the line determination bit LB becomes "0". The status of each signal after the reset processing is as shown in FIG. 7. The input select signal SLi and the output select signal SLo are reflected in the selector section (20, 30).

Figure 8:
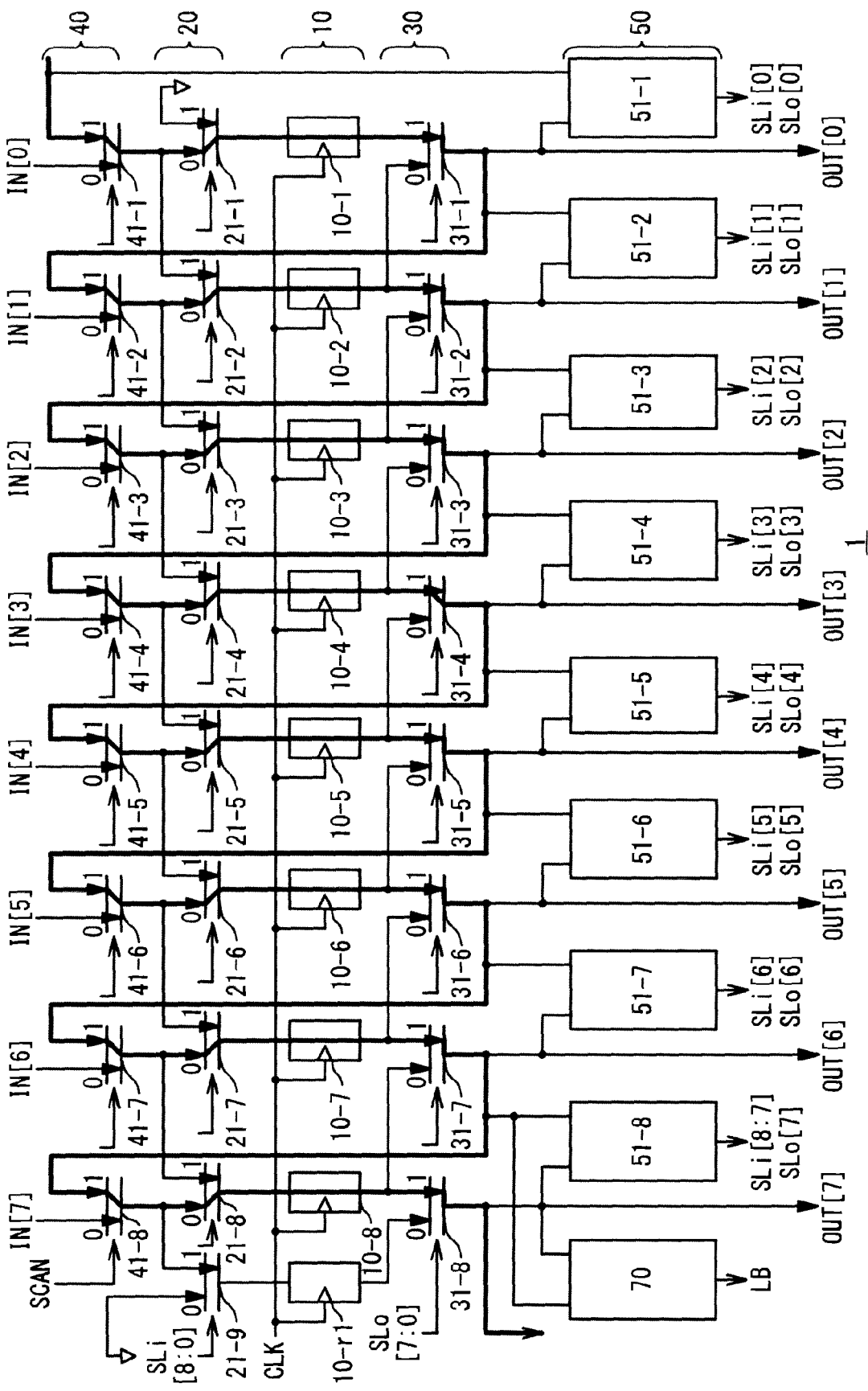
FIG. 8 shows data flow at the DC test in the first embodiment of the present invention.

FIG. 8 shows data flow at the DC test. In the case where the scan signal SCAN is "1", each scan selector 41-$k$ ($k$=1 to 8) selects the output data OUT[k−2] from the lower-bit side output selector 31-($k$−1) and outputs it. Note that the scan selector 41-1 outputs the scan data Dscan. In the case where the input select signal SLi is "0", each input selector 21-$k$ ($k$=1 to 8) selects the output data from the scan selector 41-$k$ and outputs it. In the case where the output select signal SLo is "1", each output selector 31-$k$ ($k$=1 to 8) selects the output data from the flip-flop 10-$k$ and outputs it. As a result, the flip-flops 10-1 to 10-8 form a scan chain as shown in FIG. 8. A recurrent pattern of "0" and "1" (i.e. 0, 1, 0, 1 . . . ) is input as the scan data Dscan to the scan chain.

The error detection/memory circuit 51-$k$ ($k$=1 to 8) receives the input data (scan input data Din) to the flip-flop 10-$k$ and the output data (scan output data Dout) from the flip-flop 10-$k$. Based on the scan input data Din and the scan output data Dout, the error detection/memory circuit 51-$k$ updates the input select signal SLi[k−1] and the output select signal SLo[k−1] as appropriate and stores them.

Figure 9:
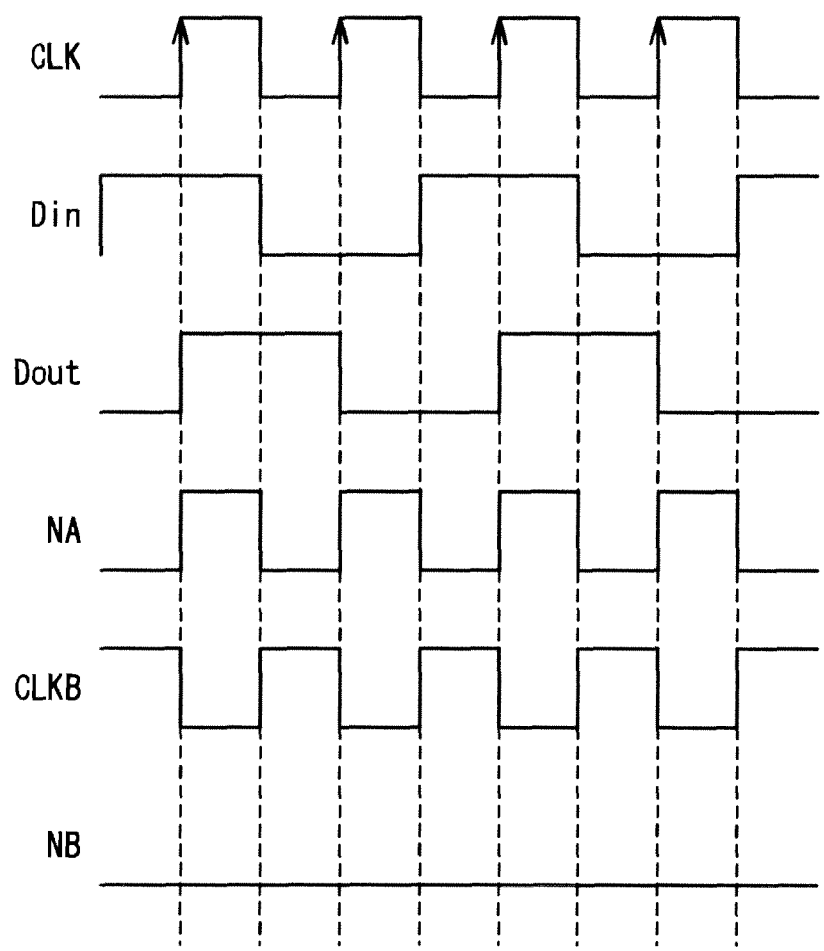
FIG. 9 is a timing chart showing transition of each signal in a case where no DC error is occurring.

FIG. 9 is a timing chart for explaining an operation of the error detection/memory circuit 51-$k$ (see FIG. 5) in a case where the flip-flop 10-$k$ operates normally. Shown in FIG. 9 are the clock signal CLK, the scan input data Din, the scan output data Dout, a signal at the node NA, the inverted clock signal CLKB and a signal at the node NB. When the flip-flop 10-$k$ operates normally, the signal at the node NB is maintained at "0". Therefore, the state of the RS latch circuit comprised of the NOR circuits 55 and 56 is maintained without change. That is, the input select signal SLi is maintained at "0" and the output select signal SLo is maintained at "1".

Figure 10:
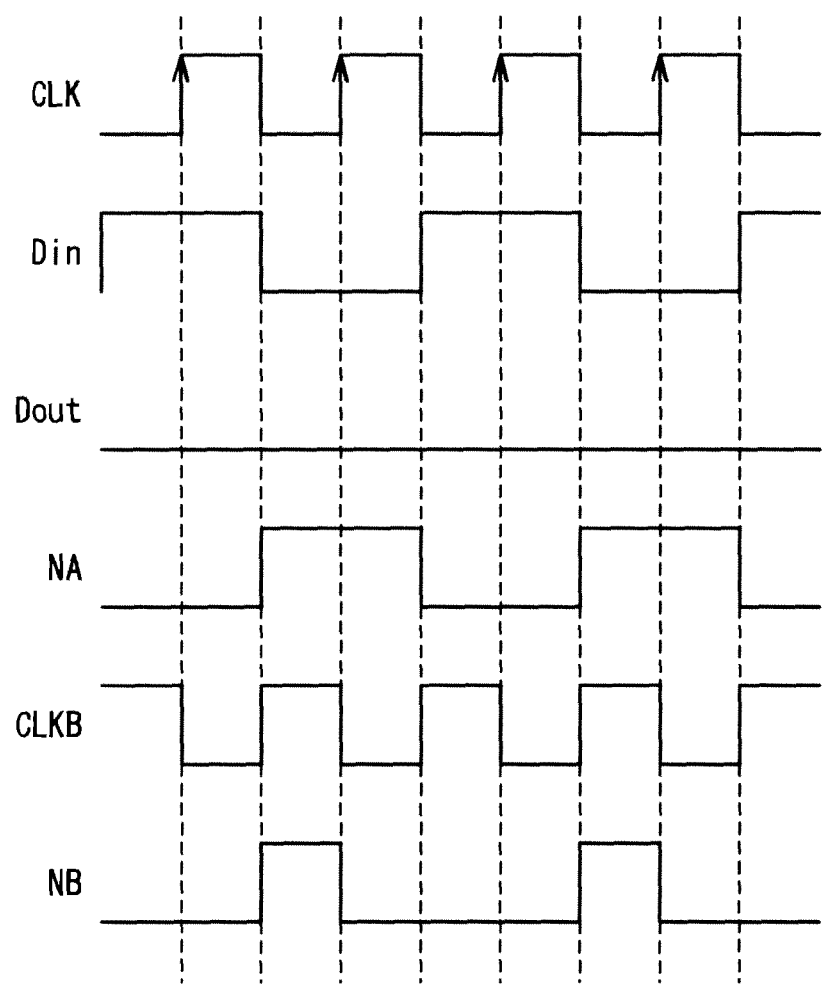
FIG. 10 is a timing chart showing transition of each signal in a case where DC error is occurring.

On the other hand, FIG. 10 shows a case where the DC error is occurring in the flip-flop 10-$k$. For example, let us consider a case where the scan output data Dout is fixed to "0". In this case, a data "1" is applied to the node NB. Therefore, the state of the RS latch circuit comprised of the NOR circuits 55 and 56 is inverted. That is, the input select signal SLi is inverted from "0" to "1" and the output select signal SLo is inverted from "1" to "0". Moreover, this signal state is retained by the RS latch circuit (memory section 60).

As an example, let us consider a case where the flip-flop 10-4 is an error flip-flop. The error detection/memory circuit 51-4 detects that the flip-flop 10-4 is an error flip-flop, inverts the input select signal SLi[3] from "0" to "1" and inverts the output select signal SLo[3] from "1" to "0". Furthermore, the recurrent pattern of "0" and "1" as the scan data Dscan is not transferred to the flip-flops 10-5 to 10-8 that exist following the error flip-flop 10-4 on the scan chain. Therefore, the state of the RS latch circuit is inverted as in the case of the error flip-flop (see FIG. 10). That is, as shown in FIG. 7, the input select signals SLi[8:3] all are inverted from "0" to "1", and the output select signals SLo[7:3] all are inverted from "1" to "0". The input select signals SLi and the output select signals SLo correspond to the reconfiguration information RECON and are stored by the RS latch circuit (memory section 60).

It should be noted that when the input select signals SLi[8:7] are inverted from "0" to "1", the line determination bit LB generated by the line determination circuit 70 also is inverted from "0" to "1". The line determination bit LB being 1 means that the DC error is occurring somewhere on the line comprised of the flip-flops 10-1 to 10-8. That is, the line determination bit LB serves as an error flag for each line. By utilizing the line determination bit LB, it is possible to perform the DC test efficiently (will be described later).

The input select signals SLi and the output select signals SLo retained by the RS latch circuit (memory section 60) are output to (reflected in) the input selector section 20 and the output selector section 30 at a predetermined timing and thus the reconfiguration processing is performed.

Figure 11:
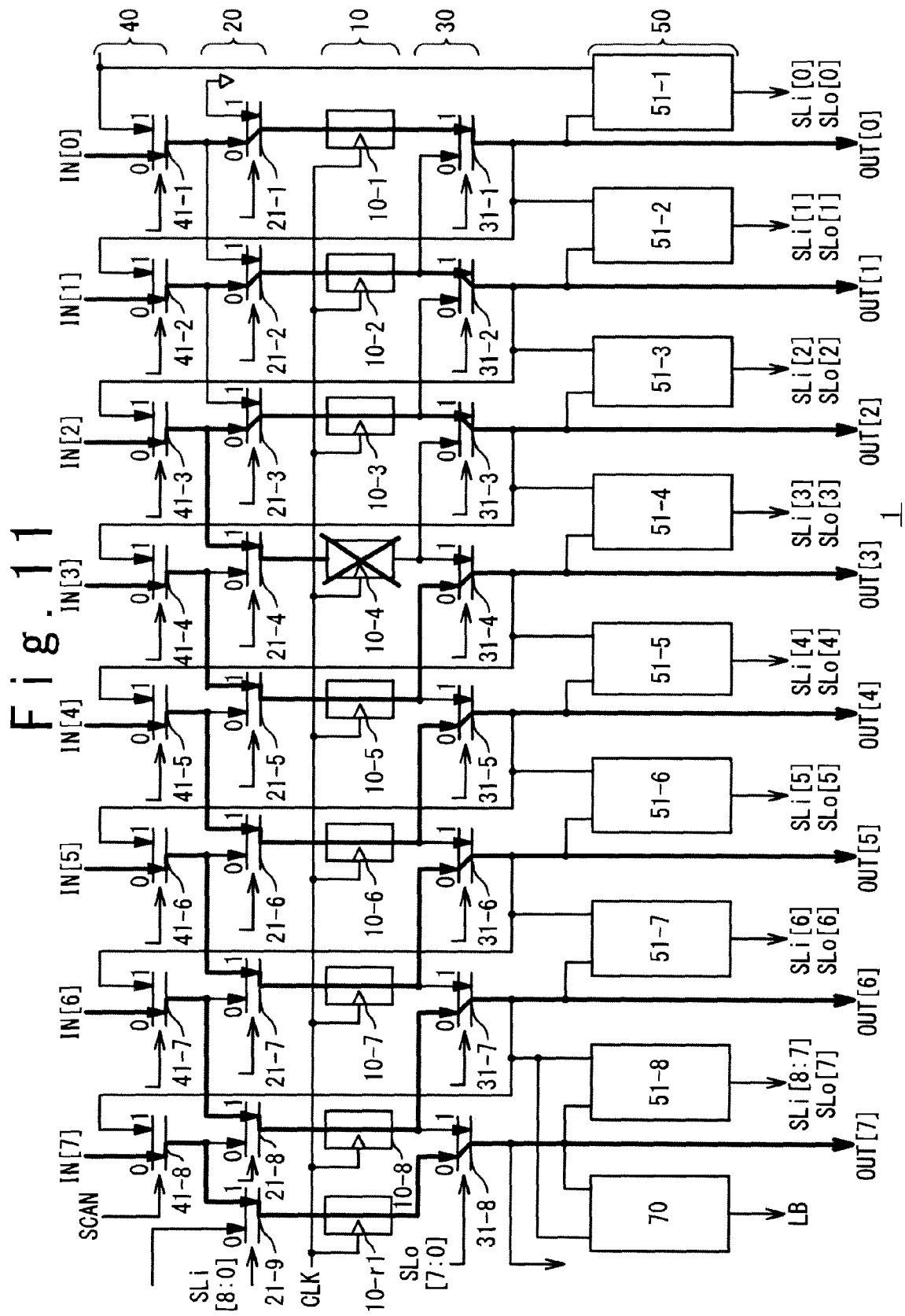
FIG. 11 shows data flow after the reconfiguration processing in the first embodiment of the present invention.

FIG. 11 shows data flow after the reconfiguration processing. In the case where the scan signal SCAN is "0", each scan selector 41-k (k=1 to 8) selects the input data IN[k−1] and outputs it. The input selectors 21-1 to 21-3 receiving the input select signal SLi="0" respectively select the output data from the scan selectors 41-1 to 41-3 and output them. On the other hand, the input selectors 21-4 to 21-9 receiving the input select signal SLi="1" respectively select the output data from the lower-bit side scan selectors 41-3 to 41-8 and output them. Moreover, the output selectors 31-1 to 31-3 receiving the output select signal SLo="1" respectively select the output data from the flip-flops 10-1 to 10-3 and output them. On the other hand, the output selectors 31-4 to 31-8 receiving the output select signal SLo="0" respectively select the output data from the upper-bit side flip-flops 10-5 to 10-8 and 10-r1 and output them. Consequently, as shown in FIG. 11, the input data IN[7:0] are output as the output data OUT[7:0] by the selected flip-flops (10-1 to 10-3, 10-5 to 10-8, 10-r1) without through the error flip-flop 10-4.

It should be noted that in the example shown in FIGS. 8 and 11, another error flip-flop may exist in the flip-flops 10-5 to 10-8 and 10-r1 subsequent to the error flip-flop 10-4. Therefore, after the latest input select signals SLi and output select signals SLo are reflected in the input selector section 20 and the output selector section 30, the scan data Dscan may be supplied to the scan chain again to perform the error detection processing again. The redundancy R is 1 in the example shown in FIGS. 8 and 11. In a generalized case, however, it is possible to repeatedly execute the error detection processing and the reconfiguration processing until using up the redundancy R.

As described above, the error detection/memory circuit 51 according to the present embodiment uses the EXNOR circuit and the RS latch circuit to efficiently perform the error detection, generation and retention of the reconfiguration information RECON (SLi, SLo). Thus, a time required for the DC test can be reduced.

Moreover, according to the present embodiment, the latch circuit in the error detection/memory circuit 51 is used as the memory section 60 for storing the reconfiguration information RECON (SLi, SLo). That is, the reconfiguration information RECON regarding a multi-bit register section 1 is stored in the local memory section 60 in the multi-bit register section 1. As a comparative example, let us consider a case where the reconfiguration information RECON regarding a plurality of multi-bit register sections 1 is collectively stored in a flash memory. In this case, signal interconnections between the flash memory and the plurality of multi-bit register sections 1 become congested, which is a problem. According to the present embodiment, the problem of the signal interconnection congestion can be solved.

1-3. Power-Supply Voltage Adaptive Control System

The semiconductor integrated circuit according to the present embodiment is preferably applied to an "extremely low power circuit". With respect to the extremely low power circuit, it is required to set an operation voltage VDD as low as possible. Hereinafter, a "power-supply voltage adaptive control system" that appropriately controls the operation voltage VDD will be described.

Figure 12:
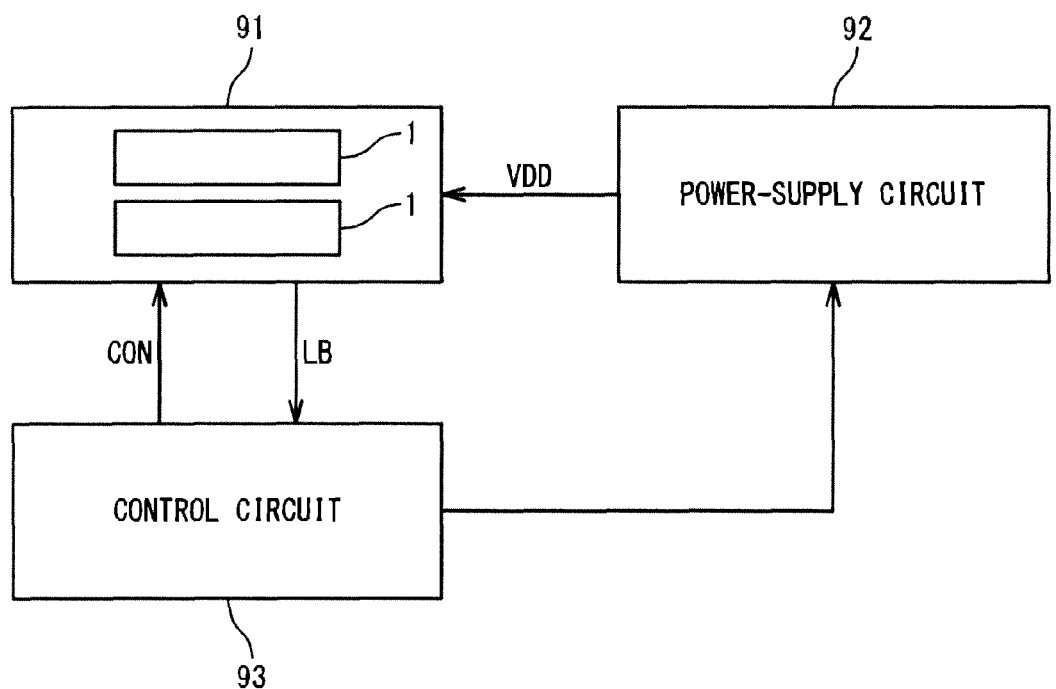
FIG. 12 is a block diagram showing a configuration of a power-supply voltage adaptive control system according to the first embodiment of the present invention.

FIG. 12 is a block diagram showing a configuration of the power-supply voltage adaptive control system 90 according to the present embodiment. The power-supply voltage adaptive control system 90 has a target circuit 91, a power-supply circuit 92 and a control circuit 93. The target circuit 91 is a semiconductor integrated circuit as a voltage-control target and has the above-described multi-bit register section 1. The power-supply circuit 92 at least supplies the operation voltage VDD of the flip-flops 10 to the multi-bit register section 1. The control circuit 93 is connected to the target circuit 91 and the power-supply circuit 92 and controls operations of them. More specifically, the control circuit 93 outputs a control signal CON for controlling the DC test and the reconfiguration processing to the target circuit 91. Moreover, the control circuit 93 receives the line determination bit LB from the multi-bit register section 1. Furthermore, the control circuit 93 controls the power-supply circuit 92 as necessary.

The power-supply voltage adaptive control system 90 may be constructed on a single semiconductor chip. Alternatively, the target circuit 91, the power-supply circuit 92 and the control circuit 93 may be respectively formed on separate semiconductor chips. The control circuit 93 may be a computer.

Figure 13:
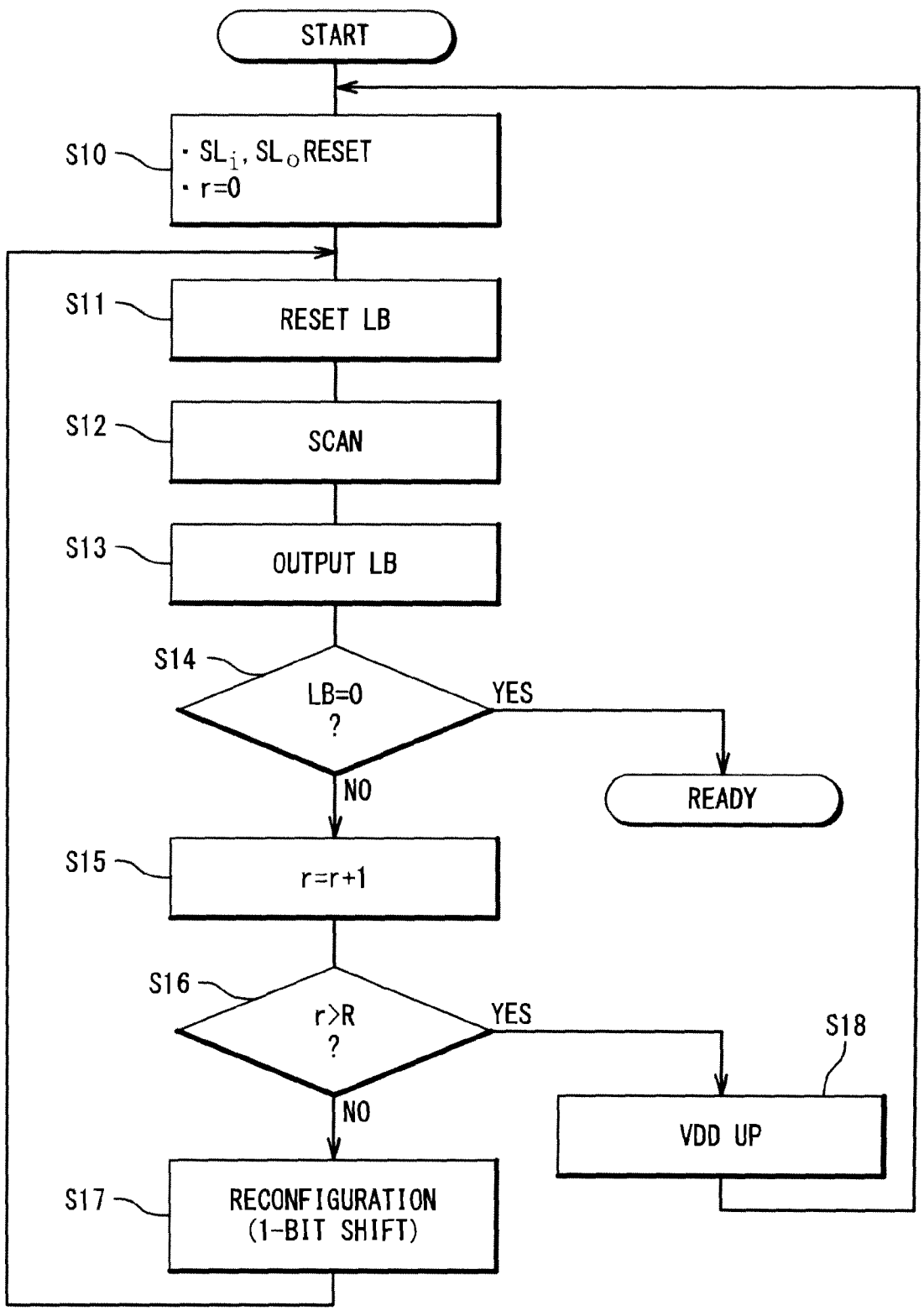
FIG. 13 is a flow chart showing an operation of the power-supply voltage adaptive control system according to the first embodiment of the present invention.

FIG. 13 is a flow chart showing an operation of the power-supply voltage adaptive control system 90 according to the present embodiment. The operation voltage VDD supplied by the power-supply circuit 92 is initially set to an extremely low voltage (for example, 0.5 V or less).

First, the control circuit 93 outputs the control signal CON to the target circuit 91 to reset the reconfiguration information RECON (SLi, SLo) (Step S10). Also, the control circuit 93 sets a parameter r to an initial value 0. The parameter r is the number of redundant flip-flop 10-r used. Subsequently, the control circuit 93 outputs the control signal CON to the target circuit 91 to reset the line determination bit LB to "0" (Step S11).

Next, the control circuit 93 outputs the control signal CON to the target circuit 91 to have it execute scan processing using the scan data Dscan (Step S12). When the scan processing is completed, the multi-bit register section 1 of the target circuit 91 outputs the above-mentioned line determination bit LB to the control circuit 93 (Step S13).

If the line determination bit LB is "0" (Step S14; Yes), no error flip-flop exists. Therefore, the process ends. On the other hand, if the line determination bit LB is "1" (Step S14; No), there exists an error flip-flop. In this case, the control circuit 93 increases the parameter r by 1 (Step S15).

If the parameter r is within the redundancy R (Step S16; No), the control circuit 93 outputs the control signal CON to the target circuit 91 to have it execute the above-described reconfiguration processing (Step S17). As a result, the error flip-flop is skipped, the selected flip-flops subsequent to the error flip-flop are shifted by one bit, and one redundant flip-flop 10-$r$ is consumed (see FIG. 11). After that, the process returns back to the Step S11 and the same processing is repeated.

On the other hand, if the parameter r exceeds the redundancy R (Step S16; Yes), the error flip-flop cannot be excluded any more. In this case, the extremely low voltage which causes the DC error is slightly loosened up. For that purpose, the control circuit 93 instructs the power-supply circuit 92 to increase the operation voltage VDD slightly (Step S18). After that, the process returns back to the beginning (Step S10).

In this manner, according to the present embodiment, the operation voltage VDD is slightly increased if any error flip-flop still remains even when all the redundant flip-flops 10-$r$1 to 10-$r$R are used. It is thus possible to set the operation voltage VDD as low as possible with eliminating the error flip-flop. As a result, the power consumption is suppressed to a minimum necessary level.

Moreover, according to the present embodiment, the control circuit 93 performs the control processing based on the line determination bit LB. The target circuit 91 need not transmit all the signals SLi, SLo to the control circuit 93 and just needs to transmit only the line determination bit LB to the control circuit 93. Therefore, interconnections between the target circuit 91 and the control circuit 93 are simplified and also speed of the control processing can be increased. This is especially effective for a case where the number of bits of the multi-bit register section 1 is extremely large.

Figure 14:
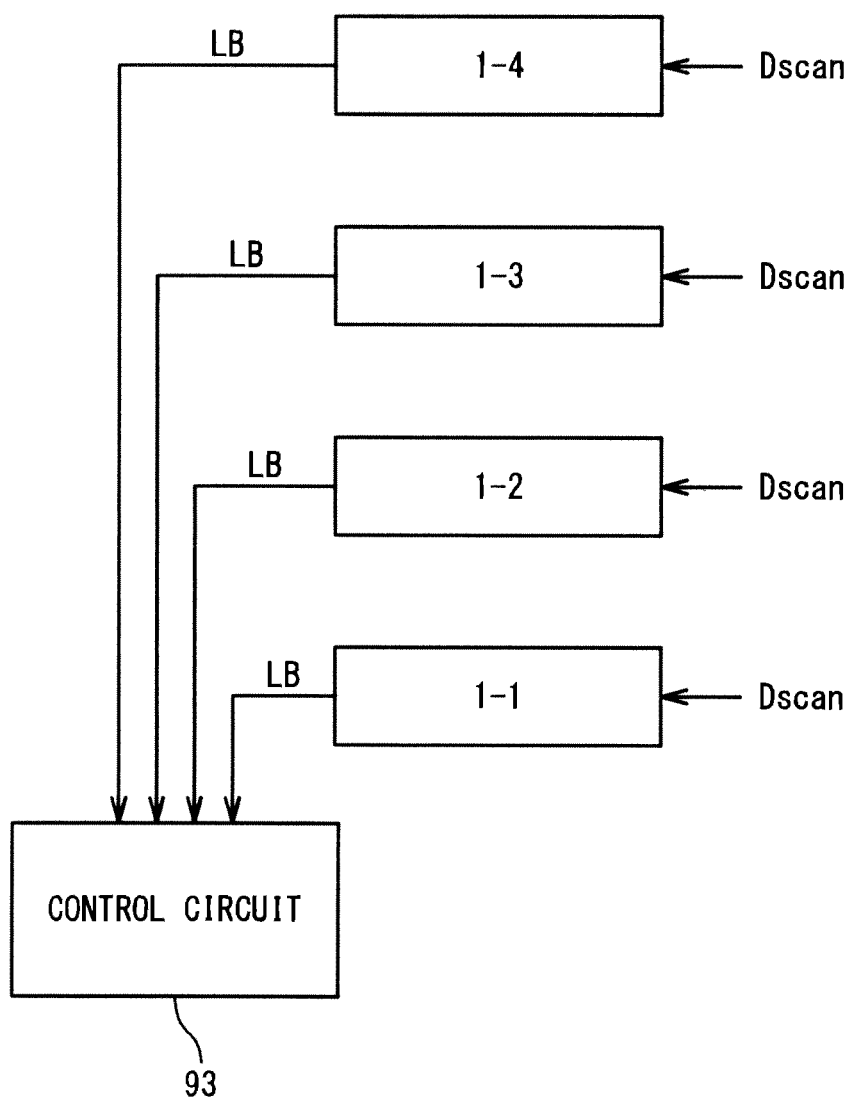
FIG. 14 is a schematic diagram showing a case where a line parallel test is performed.

The same applies to a case where the target circuit 91 is provided with a plurality of multi-bit register sections 1. For example, FIG. 14 shows a case of a "line parallel test" where the DC test is performed in parallel with respect to a plurality of multi-bit register sections 1-1 to 1-4. The scan data Dscan is supplied in parallel to the plurality of multi-bit register sections 1-1 to 1-4. The control circuit 93 receives the line determination bit LB from each of the plurality of multi-bit register sections 1-1 to 1-4. Then, the control circuit 93 determines, based on the received line determination bit LB, whether or not to increase the operation voltage VDD. In the case of the line parallel test, the operation voltage VDD is increased until the line determination bits LB received from the multi-bit register sections 1 all become "0".

Figure 15:
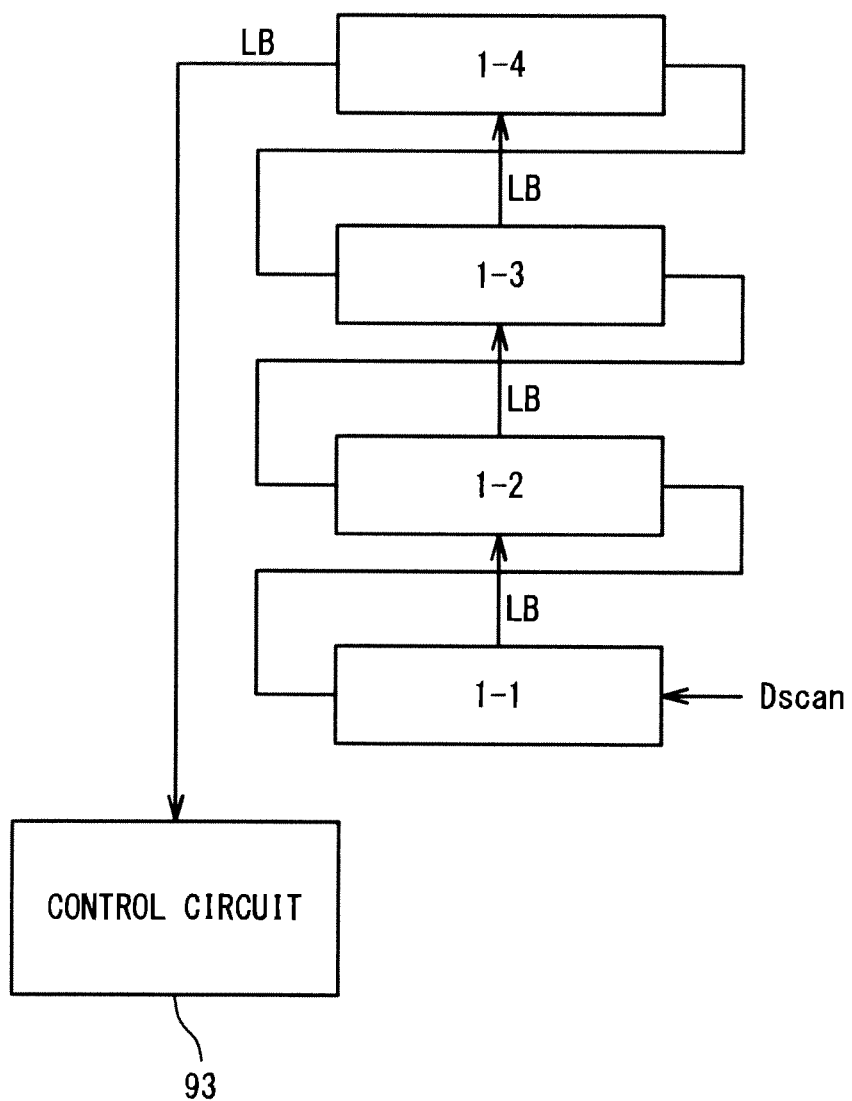
FIG. 15 is a schematic diagram showing a case where a line series test is performed.

FIG. 15 shows a case of a "line series test" where the DC test is performed in series with respect to a plurality of multi-bit register sections 1-1 to 1-4. The flip-flops 10 of the plurality of multi-bit register sections 1-1 to 1-4 form one scan chain. The scan data Dscan is supplied to the first stage multi-bit register section 1-1. The control circuit 93 receives the line determination bit LB from the last stage multi-bit register section 1-4. Then, the control circuit 93 determines, based on the received line determination bit LB, whether or not to increase the operation voltage VDD. It should be noted that the line determination bit LB may be used as a control signal such as the reset signal for the next stage.

After the error flip-flop is excluded from the scan chain by the reconfiguration processing according to the present embodiment, a usual scan test (chip test) may be performed by using the same scan chain. By performing the scan test (chip test) after the error of scan FFs is fixed, reliability of test is improved.

2. Second Embodiment

AC Characteristics Error Detection and Reconfiguration

According to a second embodiment of the present invention, "AC characteristics error" where AC characteristics such as latch characteristics and delay characteristics of the flip-flop become inadequate is detected efficiently. Furthermore, "reconfiguration processing" that replaces an error flip-flop where the AC characteristics error occurs with a redundant flip-flop is performed.

2-1. Mode-Variable Flip-Flop

First, a flip-flop 110 used in the present embodiment will be described in detail. The flip-flop 110 according to the present embodiment is configured to be capable of a toggle operation in order to test its latch characteristics. Moreover, the flip-flop 110 according to the present embodiment is configured to be capable of a self-oscillation operation in order to test its delay characteristics. In other words, the flip-flop 110 according to the present embodiment is provided with not only a usual FF mode but also test modes such as a "toggle mode" and a "self-oscillation mode". As will be described later, an operation mode of the flip-flop 110 can be switched between the plurality of modes.

Figure 16:
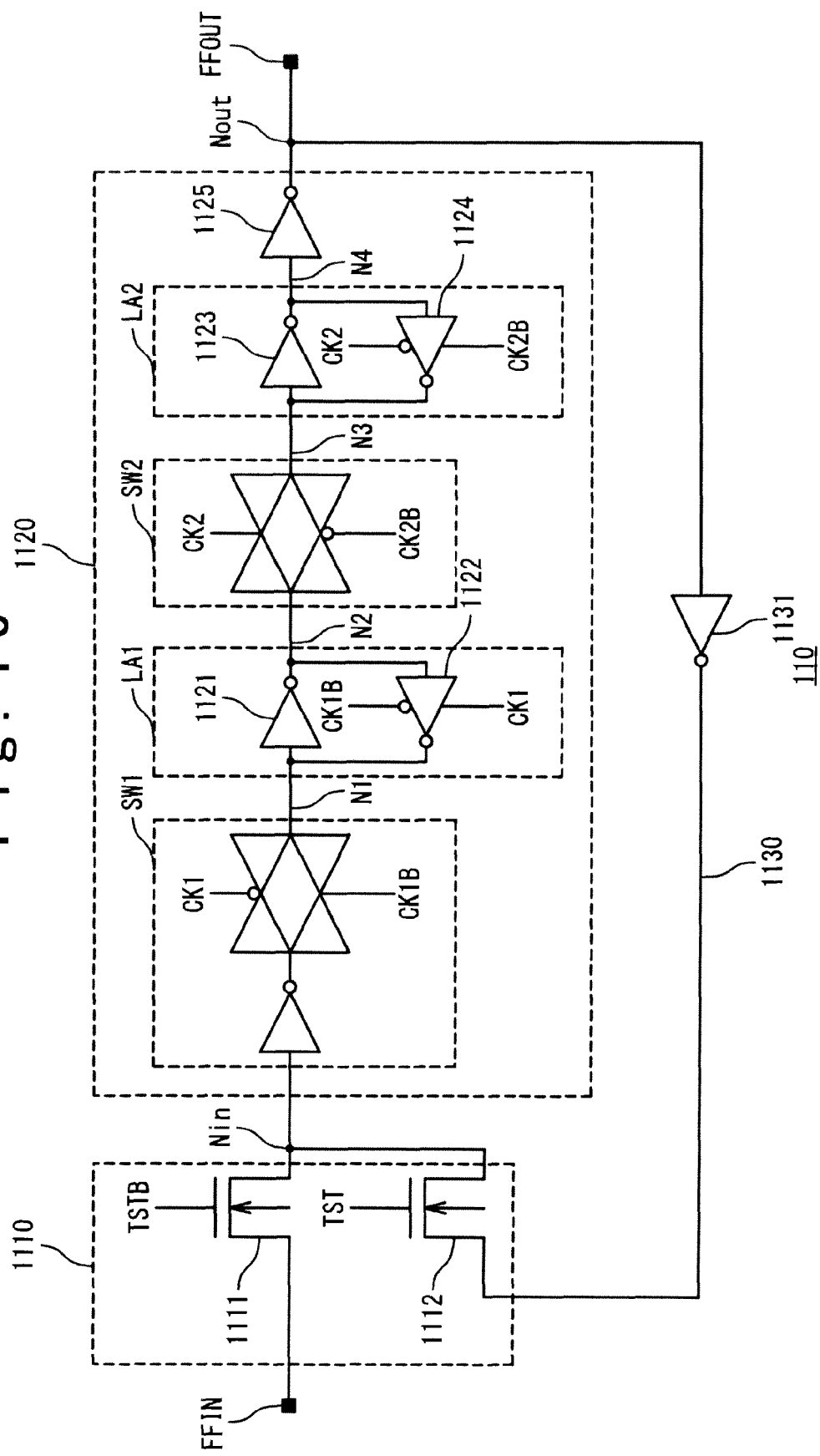
FIG. 16 is a circuit diagram showing a configuration example of a flip-flop according to a second embodiment of the present invention.

FIG. 16 is a circuit diagram showing a configuration example of the flip-flop 110 according to the present embodiment. The flip-flop 110 has a FF input terminal FFIN and a FF output terminal FFOUT. An external input data is input to the FF input terminal FFIN from the outside of the flip-flop 110. An external output data is output from the FF output terminal FFOUT to the outside of the flip-flop 110.

The flip-flop 110 further has a FF section 1120, an input node Nin and an output node Nout. The FF section 1120 performs a basic operation as a flip-flop. The input node Nin and the output node Nout are an input terminal and an output terminal of the FF section 1120, respectively. The output node Nout is connected to the FF output terminal FFOUT. More specifically, the FF section 1120 has a first switch circuit SW1, a first latch circuit LA1, a second switch circuit SW2, a second latch circuit LA2 and an inverter 1125.

The first switch circuit SW1 is connected between the input node Nin and a node N1. The first switch circuit SW1 is turned ON/OFF depending on a first clock signal CK1 (and a first inverted clock signal CK1B). More specifically, the first switch circuit SW1 is turned OFF when the first clock signal CK1 is High level, and the first switch circuit SW1 is turned ON when the first clock signal CK1 is Low level. For example, the first switch circuit SW1 is comprised of an inverter and a transfer gate as shown in FIG. 16.

The first latch circuit LA1 is connected between the node N1 and a node N2. The first latch circuit LA1 operates based on the first clock signal CK1 (and the first inverted clock signal CK1B). More specifically, the first latch circuit LA1 performs data latch when the first clock signal CK1 is High level. For example, the first latch circuit LA1 is comprised of an inverter 1121 and a clocked-inverter 1122 as shown in FIG. 16.

The second switch circuit SW2 is connected between the node N2 and a node N3. The second switch circuit SW2 is turned ON/OFF depending on a second clock signal CK2 (and a second inverted clock signal CK2B). More specifically, the second switch circuit SW2 is turned ON when the second clock signal CK2 is High level, and the second switch circuit SW2 is turned OFF when the second clock signal CK2 is Low level. For example, the second switch circuit SW2 is comprised of a transfer gate as shown in FIG. 16.

The second latch circuit LA2 is connected between the node N3 and a node N4. The second latch circuit LA2 operates based on the second clock signal CK2 (and the second inverted clock signal CK2B). More specifically, the second latch circuit LA2 performs data latch when the second clock signal CK2 is Low level. For example, the second latch circuit LA2 is comprised of an inverter 1123 and a clocked-inverter 1124 as shown in FIG. 16.

The inverter 1125 is connected between the node N4 and the output node Nout.

The flip-flop 110 according to the present embodiment further has a FF selector section 1110 and a feedback path 1130. The feedback path 1130 connects between the output node Nout and the input node Nin of the FF section 1120. As shown in FIG. 16, an inverter 1131 is provided on the feedback path 1130.

The FF selector section 1110 is provided at the former stage of the input node Nin. The FF selector section 1110 selects either the external input data input to the FF input terminal FFIN or a feedback data fed back through the feedback path 1130 and outputs the selected data to the input node Nin.

More specifically, the FF selector section 1110 has switches 1111 and 1112. The switch 1111 is connected between the FF input terminal FFIN and the input node Nin and is turned ON/OFF depending on an inverted test signal TSTB. The switch 1112 is connected between the inverter 1131 and the input node Nin and is turned ON/OFF depending on a test signal TST. For example, each of the switches 1111 and 1112 is comprised of an N-channel MOS transistor.

At the usual FF mode, the test signal TST is Low level and the inverted test signal TSTB is High level. In this case, the switch 1111 is turned ON while the switch 1112 is turned OFF. Therefore, the external input data input to the FF input terminal FFIN is transferred to the input node Nin. That is, the FF selector section 1110 selects the external input data and outputs it to the input node Nin. It can be said that the feedback path 1130 is deactivated at the usual FF mode.

On the other hand, at the test modes (the toggle mode and the self-oscillation mode), the test signal TST is High level and the inverted test signal TSTB is Low level. In this case, the switch 1111 is turned OFF while the switch 1112 is turned ON. Therefore, the feedback data fed back through the feedback path 1130 is transferred to the input node Nin. That is, the FF selector section 1110 selects the feedback data and outputs it to the input node Nin. In this manner, the feedback path 1130 is activated at the test modes (the toggle mode and the self-oscillation mode).

Figure 17:
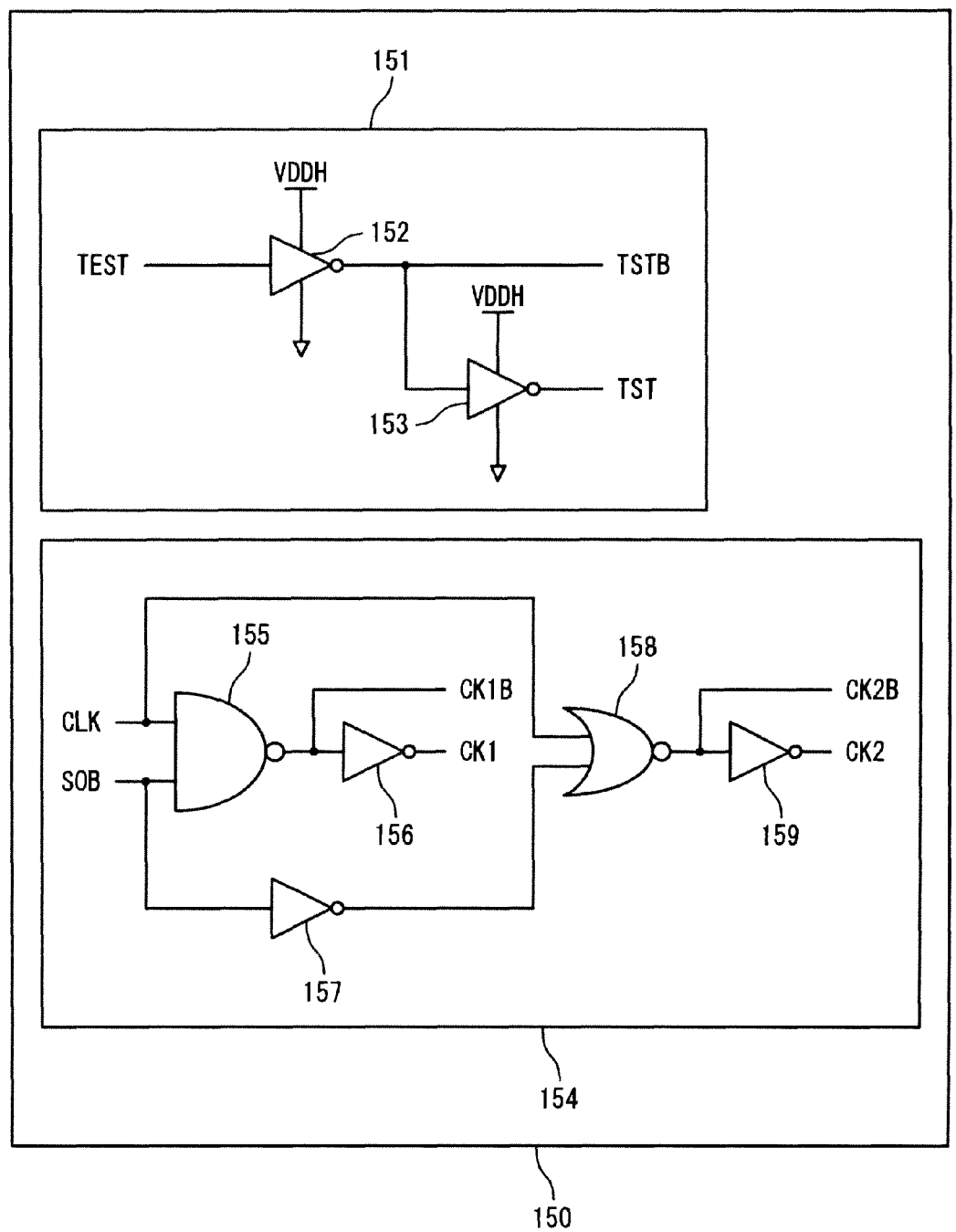
FIG. 17 is a circuit diagram showing a configuration example of a mode control circuit according to the second embodiment of the present invention.

FIG. 17 shows a configuration example of a mode control circuit 150 for controlling the operation mode of the flip-flop 110 according to the present embodiment. The mode control circuit 150 has a test signal generation circuit 151 and a clock generation circuit 154.

The test signal generation circuit 151 generates the test signal TST and the inverted test signal TSTB mentioned above, depending on a test signal TEST. More specifically, the test signal generation circuit 151 has inverters 152 and 153 as shown in FIG. 17. At the test mode, the test signal TEST is High level. As a result, the test signal TST is High level and the inverted test signal TSTB is Low level. It should be noted that a high voltage VDDH is preferably used as a voltage of the signals TST and TSTB for driving the switches (N-channel MOS transistors) 1111 and 1112, from a viewpoint of reduction in a signal delay and an area of the FF selector section 1110.

The clock generation circuit 154 generates the first clock signal CK1, the first inverted clock signal CK1B, the second clock signal CK2 and the second inverted clock signal CK2B mentioned above, depending on the clock signal CLK and a signal SOB. More specifically, the clock generation circuit 154 has a N AND circuit 155, inverters 156, 157, a NOR circuit 158 and an inverter 159 as shown in FIG. 17.

The operation of the flip-flop 110 at each operation mode will be hereinafter described with reference to FIGS. 16 and 17 as appropriate.

(Usual FF Mode)

At the usual FF mode, the test signal TEST is set to Low level. In this case, the inverted test signal TSTB is High level and thus the switch 1111 is turned ON. Meanwhile, the switch 1112 is turned OFF and the feedback path 1130 is deactivated. Moreover, the signal SOB is set to High level ("1"). Therefore, the first clock signal CK1 and the second clock signal CK2 both are the same as the clock signal CLK. In this case, the FF section 1120 performs a usual latch operation.

(Toggle Mode)

Figure 18:
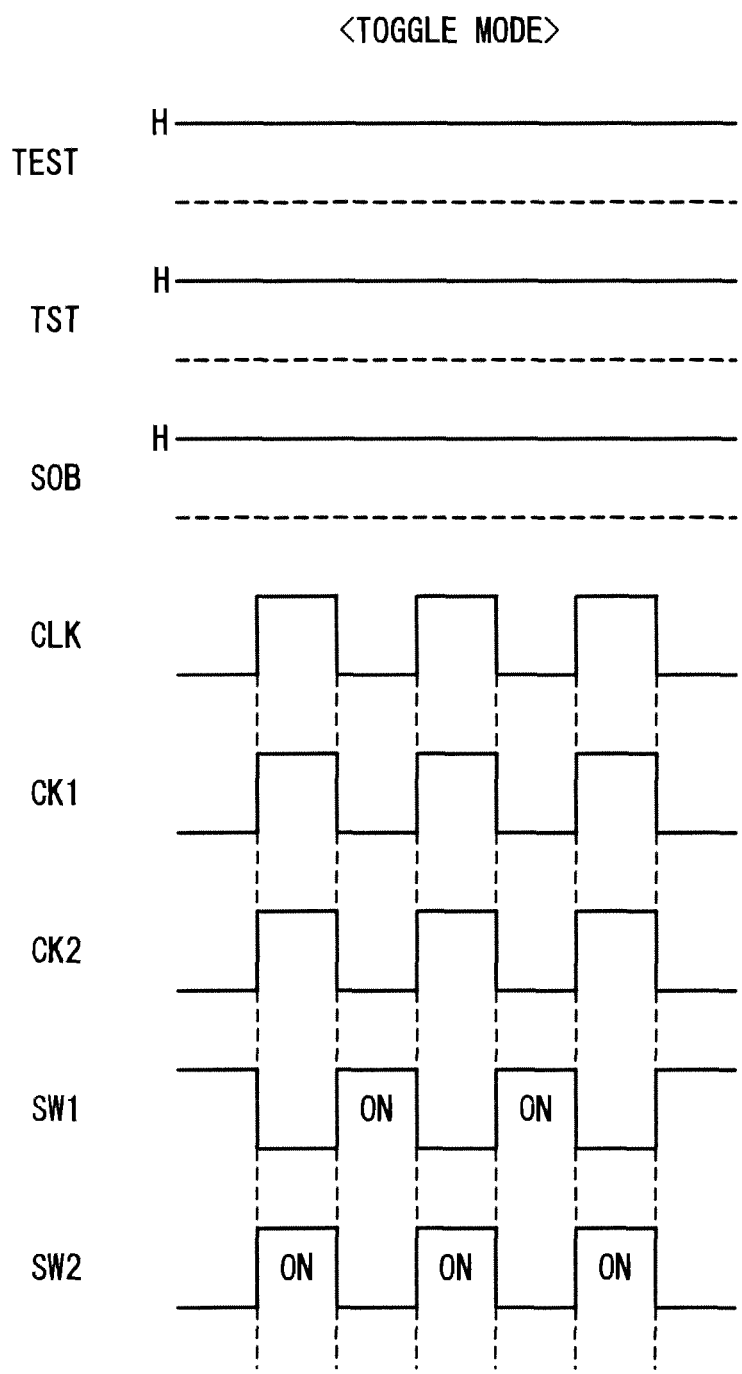
FIG. 18 is a timing chart showing an operation of the flip-flop at a toggle mode according to the second embodiment of the present invention.

FIG. 18 is a timing chart showing the operation of the flip-flop 110 at the toggle mode. At the toggle mode, the test signal TEST is set to High level and thus the test signal TST is High level. In this case, the switch 1111 is turned OFF while the switch 1112 is turned ON, and thus the feedback path 1130 is activated.

In the case of the toggle mode, the signal SOB is set to High level ("1"). Therefore, the FF section 1120 performs the usual latch operation as in the case of the above-described usual FF mode. More specifically, the first clock signal CK1 and the second clock signal CK2 both are the same as the clock signal CLK. In this case, in the FF section 1120, the first switch circuit SW1 and the second switch circuit SW2 are alternately turned ON and the first latch circuit LA1 and the second latch circuit LA2 alternately perform the data latch. Note that since the feedback path 1130 is being activated, the FF section 1120 continues to latch the data "0" and the data "1" alternately. In this manner, the flip-flop 110 performs the toggle operation by the use of the feedback path 1130 at the toggle mode.

(Self-Oscillation Mode)

Figure 19:
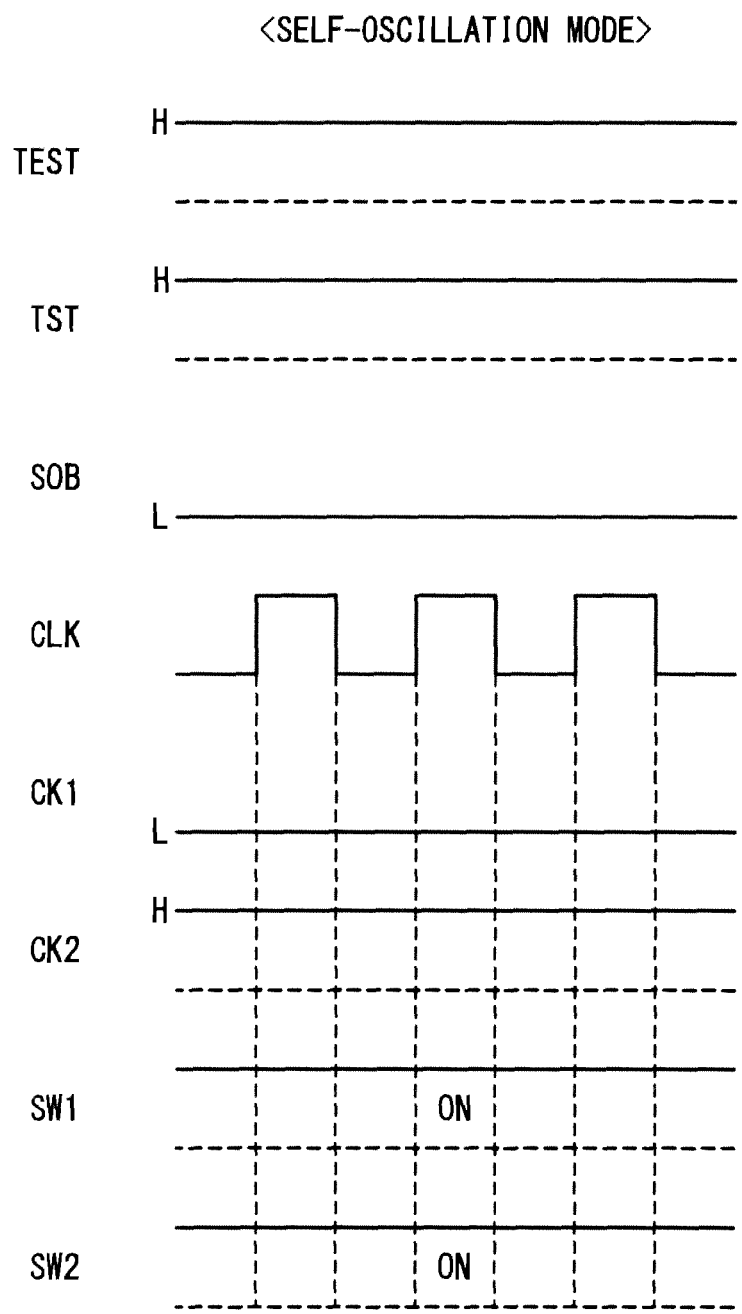
FIG. 19 is a timing chart showing an operation of the flip-flop at a self-oscillation mode according to the second embodiment of the present invention.

FIG. 19 is a timing chart showing an operation of the flip-flop 110 at the self-oscillation mode. At the self-oscillation mode, the test signal TEST is set to High level and thus the test signal TST is High level. In this case, the switch 1111 is turned OFF while the switch 1112 is turned ON, and thus the feedback path 1130 is activated.

In the case of the self-oscillation mode, the signal SOB is set to Low level ("0"). In this case, the first clock signal CK1 is maintained at Low level and the second clock signal CK2 is maintained at High level. Therefore, in the FF section 1120, the first switch circuit SW1 and the second switch circuit SW2 both are maintained at ON state. As a result, the first switch circuit SW1 (clocked-inverter), the inverter 1121 of the first latch circuit LA1, the inverter 1123 of the second latch circuit LA2, the inverter 1125 and the inverter 1131 on the feedback path 1130 form an oscillation circuit. That is, the flip-flop 110 does not perform the latch operation but performs self-oscillation. In this manner, the flip-flop 110 performs the self-oscillation operation by the use of the feedback path 1130 at the self-oscillation mode.

2-2. AC Characteristics Error Detection

Figure 20:
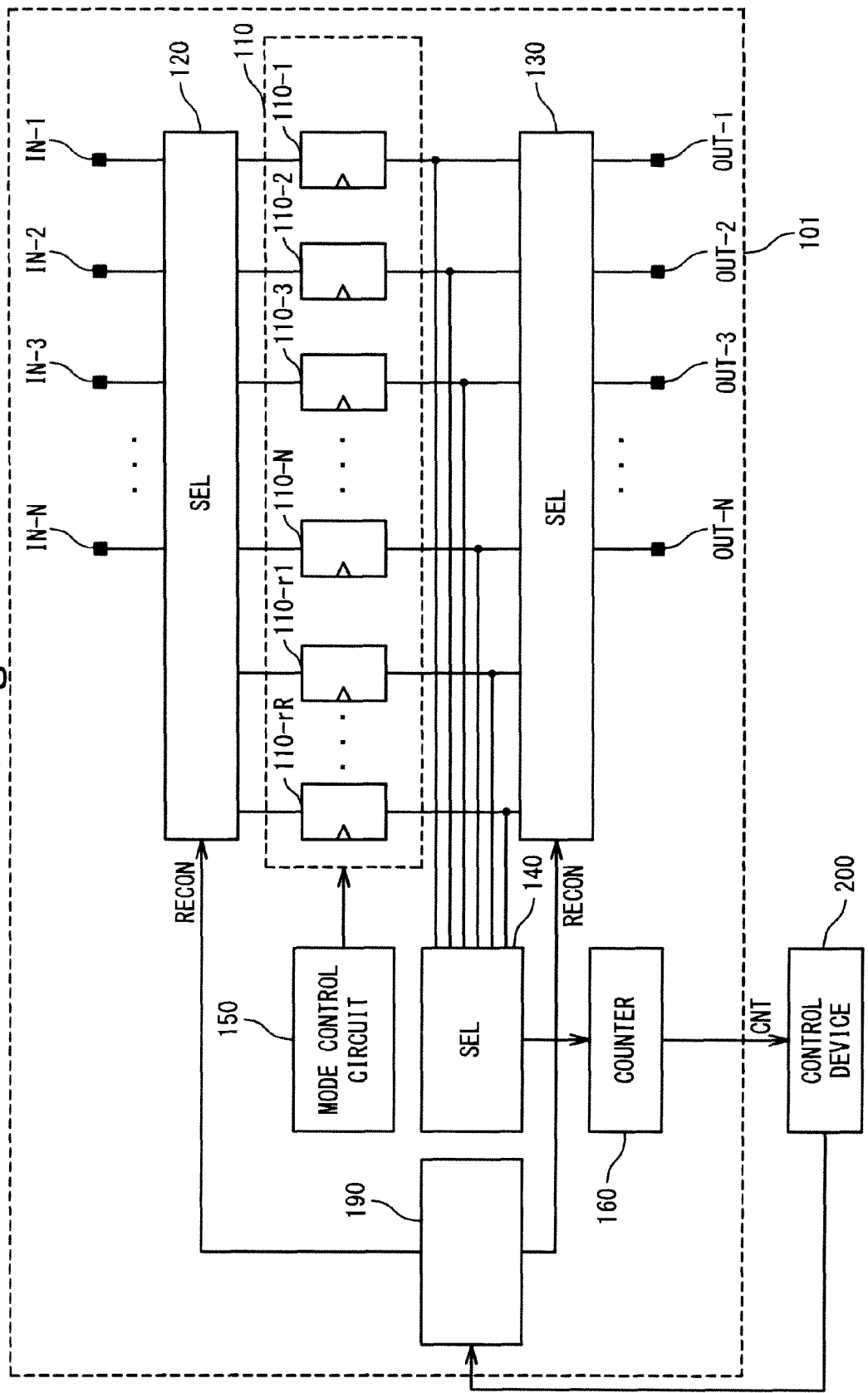
FIG. 20 is a block diagram schematically showing a configuration of a semiconductor integrated circuit according to the second embodiment of the present invention.

FIG. 20 is a block diagram schematically showing a configuration of a semiconductor integrated circuit according to the second embodiment. The semiconductor integrated circuit according to the present embodiment has a multi-bit register section 101 that stores plural bit data. The multi-bit register section 101 has N input terminals IN-1 to IN-N (N is an integer equal to or more than 1) and N output terminals OUT-1 to OUT-N. The multi-bit register section 101 stores N-bit data respectively input to the input terminals IN-1 to IN-N and outputs the N-bit data respectively from the output terminals OUT-1 to OUT-N.

More specifically, the multi-bit register section 101 has a plurality of flip-flops 110 for storing the N-bit data. Each flip-flop 110 has the configuration shown in the foregoing FIG. 16. In the present embodiment, the plurality of flip-flops 110 include at least one redundant flip-flop. That is, the plurality of flip-flops 110 include N flip-flops 110-1 to 110-N and R redundant flip-flops 110-r1 to 110-rR. Here, R being an integer equal to or more than 1 represents "redundancy". Then, "N selected flip-flops" among the N+R flip-flops 110 are used for storing the N-bit data input to the input terminals IN-1 to IN-N.

It is reconfiguration information RECON and a selector section (120, 130) that is used for selecting the N selected flip-flops. The reconfiguration information RECON is a data that specifies the N selected flip-flops. The selector section (120, 130) selects the N selected flip-flops from the plurality of flip-flops 110 depending on the reconfiguration information RECON. Then, the selector section (120, 130) switches data flow such that the N-bit data input to the N input terminals IN-1 to IN-N are respectively output to the N output terminals OUT-1 to OUT-N by the N selected flip-flops.

More specifically, the multi-bit register section 101 has an input selector section 120 and an output selector section 130, as shown in FIG. 20.

The input selector section 120 is provided between the N input terminals IN-1 to IN-N and the N+R flip-flops 110. The input selector section 120 switches, depending on the reconfiguration information RECON, a connection relationship between the N input terminals IN-1 to IN-N and the N+R flip-flops 110. More specifically, the input selector section 120 sets up the connection relationship based on the reconfiguration information RECON such that the N-bit data input to the N input terminals IN-1 to IN-N are supplied to the N selected flip-flops.

The output selector section 130 is provided between the N+R flip-flops 110 and the N output terminals OUT-1 to OUT-N. The output selector section 130 switches, depending on the reconfiguration information RECON, a connection relationship between the N output terminals OUT-1 to OUT-N and the N+R flip-flops 110. More specifically, the output selector section 130 sets up the connection relationship based on the reconfiguration information RECON such that the N-bit data output from the N selected flip-flops are output to the N output terminals OUT-1 to OUT-N.

The multi-bit register section 101 further has the mode control circuit 150 shown in FIG. 17. The mode control circuit 150 supplies the above-mentioned signals (TST, TSTB, CK1, CK1B, CK2, CK2B) to the plurality of flip-flops 110.

The multi-bit register section 101 further has a count-target selector 140, a counter 160 and a memory circuit 190.

The count-target selector 140 is connected to the respective FF output terminals FFOUT of the plurality of flip-flops 110. At the test mode, each flip-flop 110 performs the toggle operation or the self-oscillation operation. At this time, the count-target selector 140 transfers one by one the output data respectively output from the plurality of flip-flops 110 to the counter 160. That is, at the test mode, the count-target selector 140 selects a target flip-flop one by one from the plurality of flip-flops 110 and outputs the output data from the target flip-flop to the counter 160. The target flip-flop is switched in order for each predetermined period of time.

The counter 160 is connected to the count-target selector 140. At the test mode, the counter 160 receives the output data from the target flip-flop through the count-target selector 140. Then, the counter 160 performs counting with regard to the received output data for a predetermined period of time. That is, the counter 160 counts the number of toggle times of the output data or the number of oscillation times during a predetermined period of time. Moreover, the counter 160 outputs a count signal CNT indicating the count value thus obtained with regard to the target flip-flop to the control device 200. Since the target flip-flop is switched in turn, the counter 160 outputs the count signals CNT regarding the respective flip-flops 110 one by one to the control device 200.

The control device 200 is, for example, a computer connected to the semiconductor integrated circuit according to the present embodiment. The control device 200 receives the count signals CNT regarding the respective flip-flops 110 from the counter 160. Then, the control device 200 detects, based on the count value indicated by the count signal CNT, an error flip-flop where the AC characteristics are inadequate.

For example, in the case of the toggle mode, a flip-flop 110 where the count value (i.e. the number of toggle times in a predetermined period of time) is less than an expected value is an error flip-flop that does not perform the latch operation normally. Therefore, the control device 200 can determine whether or not a flip-flop 110 is an error flip-flop by comparing the corresponding count value with the expected value. It is thus possible to detect the error flip-flop whose latch characteristics are deteriorated.

In the case of the self-oscillation mode, the control device 200 can calculate a self-oscillation frequency based on the count value in a predetermined period of time. An flip-flop 110 whose self-oscillation frequency is less than an expected value is an error flip-flop whose delay characteristics are deteriorated. Therefore, the control device 200 can determine whether or not a flip-flop 110 is an error flip-flop by comparing the corresponding self-oscillation frequency with the expected value. It is thus possible to detect the error flip-flop whose delay characteristics are deteriorated.

In this manner, the control device 200 detects an error flip-flop where the AC characteristics error is occurring. If the number of the detected error flip-flops is equal to or less than the "redundancy R", it is possible to replace the error flip-flop with the redundant flip-flop 110-r. The control device 200 generates the reconfiguration information RECON such that the redundant flip-flop 110-r instead of the detected error flip-flop is incorporated into the selected flip-flops. In other words, the control device 200 generates the reconfiguration information RECON such that the detected error flip-flop is excluded from the N selected flip-flops.

After that, the control device 200 stores the generated reconfiguration information RECON in the memory circuit 190 of the multi-bit register section 101. Preferably, the memory circuit 190 is provided with respect to each multi-bit register section 101. For example, a flip-flop or an e-fuse is used as the memory circuit 190.

The reconfiguration information RECON stored in the memory circuit 190 is output to (reflected in) the selector section 120, 130 at a predetermined timing after the test mode is ended. As a result, the error flip-flop detected at the test mode is excluded from the N selected flip-flops, and instead, the redundant flip-flop 110-r is appropriately incorporated into the selected flip-flops. This processing is the "reconfiguration processing".

According to the present embodiment, as described above, the flip-flop 110 supports the toggle mode and the self-oscillation mode. By using such the flip-flop 110, it is possible to "efficiently" detect the error flip-flop whose AC characteristics such as the latch characteristics and the delay characteristics are inadequate. Moreover, since the error flip-flop whose AC characteristics are deteriorated are excluded by the reconfiguration processing, speed characteristics of the multi-bit register section 1 can be improved.

Hereinafter, a concrete example is described.

Figure 21:
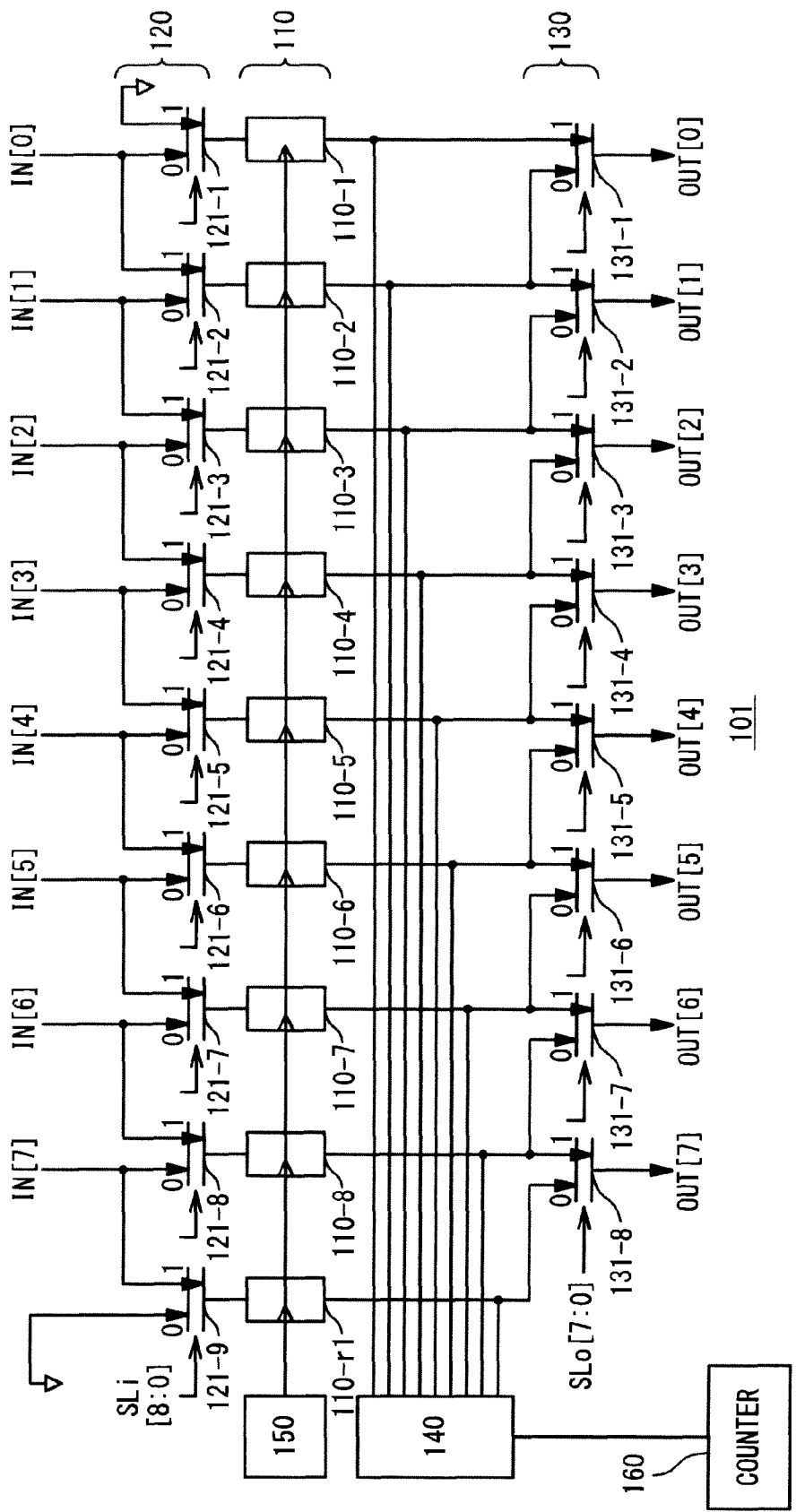
FIG. 21 is a circuit diagram showing a configuration example of the semiconductor integrated circuit according to the second embodiment of the present invention.

FIG. 21 shows an example of a circuit configuration of the multi-bit register section 101 of the semiconductor integrated circuit according to the present embodiment. In the present example, let us consider a case where N=8 and the redundancy R=1. 8-bit input data IN[7:0] are respectively input to the input terminals IN-8 to IN-1 of the multi-bit register section 101. 8-bit output data OUT[7:0] are respectively output from the output terminals OUT-8 to OUT-1 of the multi-bit register section 101. As shown in FIG. 21, the multi-bit register section 101 has the plurality of flip-flops 110 (110-1 to 110-8, 110-r1), the input selector section 120, the output selector section 130, the count-target selector 140, the mode control circuit 150 and the counter 160.

The input selector section 120 has N+1 input selectors 121-1 to 121-9. The input selector 121-k (k=1 to 8) selects, depending on an input select signal SLi[k−1], either the input data IN[k−1] or the lower-bit side input data IN[k−2] and outputs the selected data to the FF input terminal FFIN of the flip-flop 110-k. It should be noted that, in the case of the input selector 121-1, the lower-bit side input data is a fixed data. The input selector 121-9 selects, depending on the input select signal SLi[8], either a fixed data or the input data IN[7] and outputs the selected data to the FF input terminal FFIN of the redundant flip-flop 110-r1. The 9-bit input select signals SLi[8:0] correspond to the reconfiguration information RECON.

The output selector section 130 has N output selectors 131-1 to 131-8. The output selector 131-k (k=1 to 8) selects, depending on an output select signal SLo[k−1], either an output data from the flip-flop 110-k or an output data from the upper-bit side flip-flop 110-(k+1) and outputs the selected data as the output data OUT[k−1]. It should be noted that, in the case of the output selector 131-8, the upper-bit side flip-flop is the redundant flip-flop 110-r1. The 8-bit output select signal SLo[7:0] correspond to the reconfiguration information FIG. 22 shows an example of the reconfiguration information RECON (SLi, SLo). At a reset state, the input select signals SLi all are "0" and the output select signals SLo all are "1". Let us consider a case where the flip-flop 110-4 is detected as an error flip-flop at the test mode. In this case, as shown in FIG. 22, the input select signals SLi[8:3] are changed to "1" and the output select signals SLo[7:3] are changed to "0". The input select signals SLi and output select signals SLo after the change are output to (reflected in) the input selector section 120 and the output selector section 130 at a predetermined timing and thus the reconfiguration processing is performed.

Figure 23:
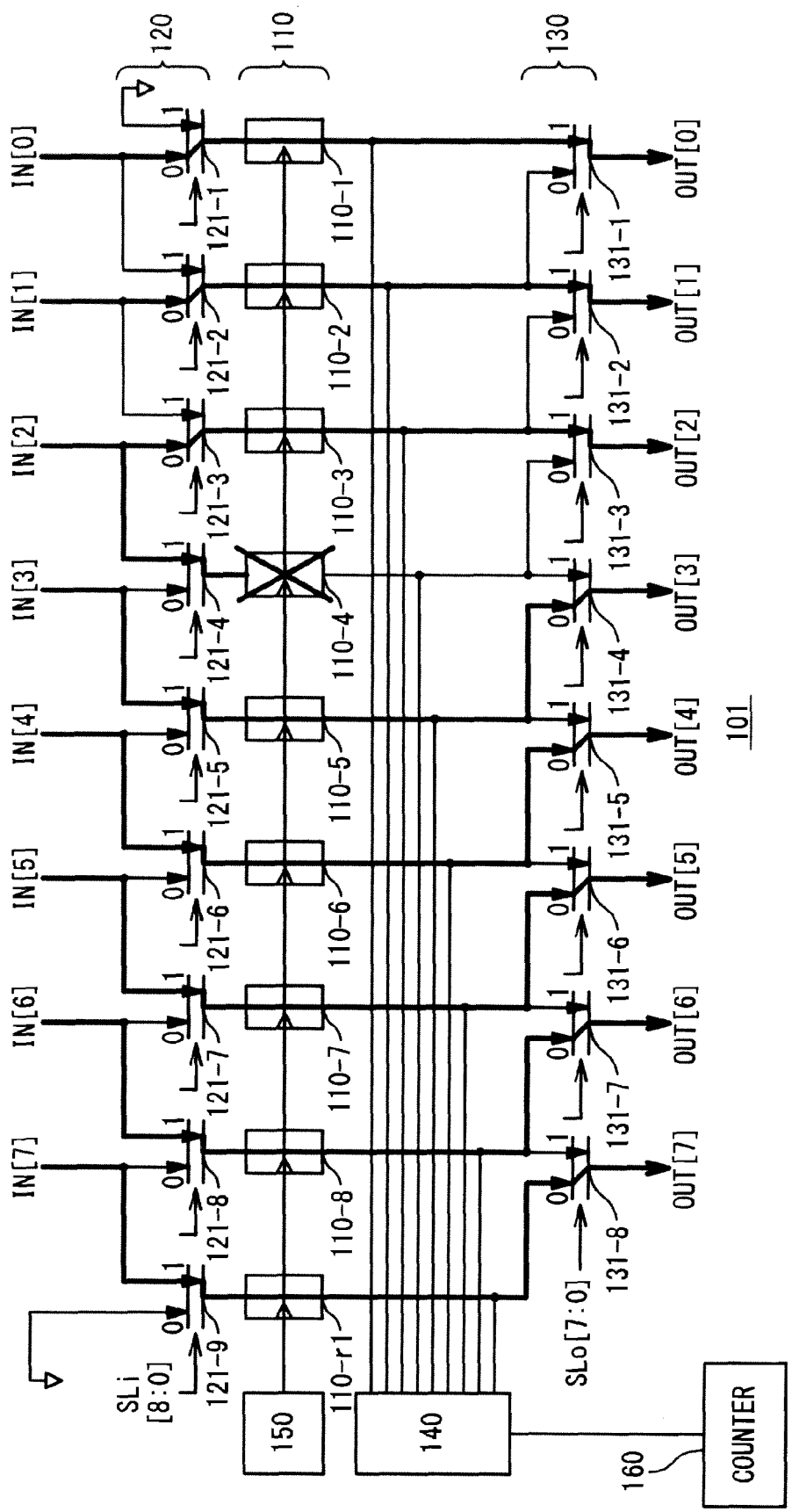
FIG. 23 shows data flow after reconfiguration processing in the second embodiment of the present invention.

FIG. 23 shows data flow after the reconfiguration processing. The input selectors 121-1 to 121-3 receiving the input select signal SLi="0" respectively select the input data IN[0] to IN[2] and output them. On the other hand, the input selectors 121-4 to 121-9 receiving the input select signals SLi="1" respectively select the lower-bit side input data IN[2] to IN[7] and output them. Moreover, the output selectors 131-1 to 131-3 receiving the output select signal SLo="1" respectively select the output data from the flip-flops 110-1 to 110-3 and output them. On the other hand, the output selectors 131-4 to 131-8 receiving the output select signal SLo="0" respectively select the output data from the upper-bit side flip-flops 110-5 to 110-8 and 110-r1 and output them. Consequently, as shown in FIG. 23, the input data IN[7:0] are output as the output data OUT[7:0] by the selected flip-flops (110-1 to 110-3, 110-5 to 110-8, 110-r1) without through the error flip-flop 110-4.

2-3. Modification Example

Next, a modification example of the second embodiment will be described. In the present modification example also, the target flip-flop is selected one by one from the plurality of flip-flops 110. However, flip-flops 110 other than the target flip-flop are effectively utilized as a counter.

Figure 24:
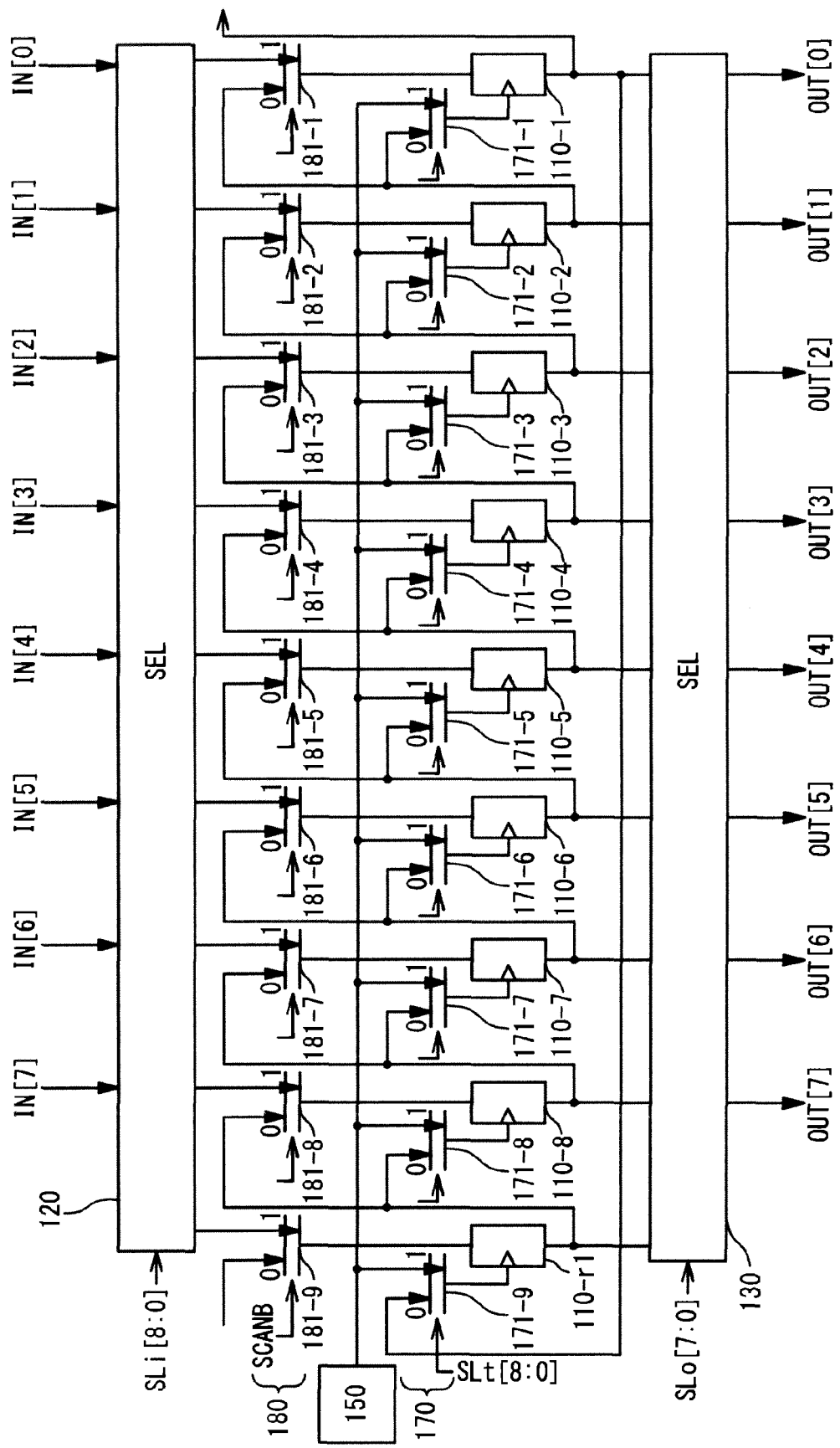
FIG. 24 is a circuit diagram showing a modification example of the semiconductor integrated circuit according to the second embodiment of the present invention.

FIG. 24 shows a circuit configuration example of the multi-bit register section 101 according to the present modification example. As compared with the foregoing configuration shown in FIG. 21, the count-target selector 140 and the counter 160 are omitted. Instead, a clock selector section 170 for switching clock input to each flip-flop 110 is added.

The clock selector section 170 has clock selectors 171-1 to 171-9. The clock selector 171-k (k=1 to 8) selects, depending on a clock select signal SLt[k−1], either the signal from the mode control circuit 150 or the output signal from the upper-bit side flip-flop 110-(k+1) and outputs the selected signal to a clock input terminal of the flip-flop 110-k. It should be noted, in the case of the clock selector 171-8, the upper-bit side flip-flop is the redundant flip-flop 110-r1. The clock selector 171-9 selects, depending on a clock select signal SLt[8], either the signal from the mode control circuit 150 or the output signal from the flip-flop 110-1 and outputs the selected signal to a clock input terminal of the redundant flip-flop 110-r1.

Moreover, a scan selector section 180 for forming a scan chain is provided. The scan selector section 180 has scan selectors 181-1 to 181-9. The scan selector 181-k (k=1 to 9) selects, depending on a scan signal SCANB, either the data from the input selector section 120 or the output data from the upper-bit side flip-flop 110-(k+1) and outputs the selected data to the flip-flop 110-k. At a scan mode, the scan signal SCANB is set to "0". In this case, each scan selector 181 outputs the output data from the upper-bit side flip-flop 110-(k+1) to the flip-flop 110-k.

Figure 25:
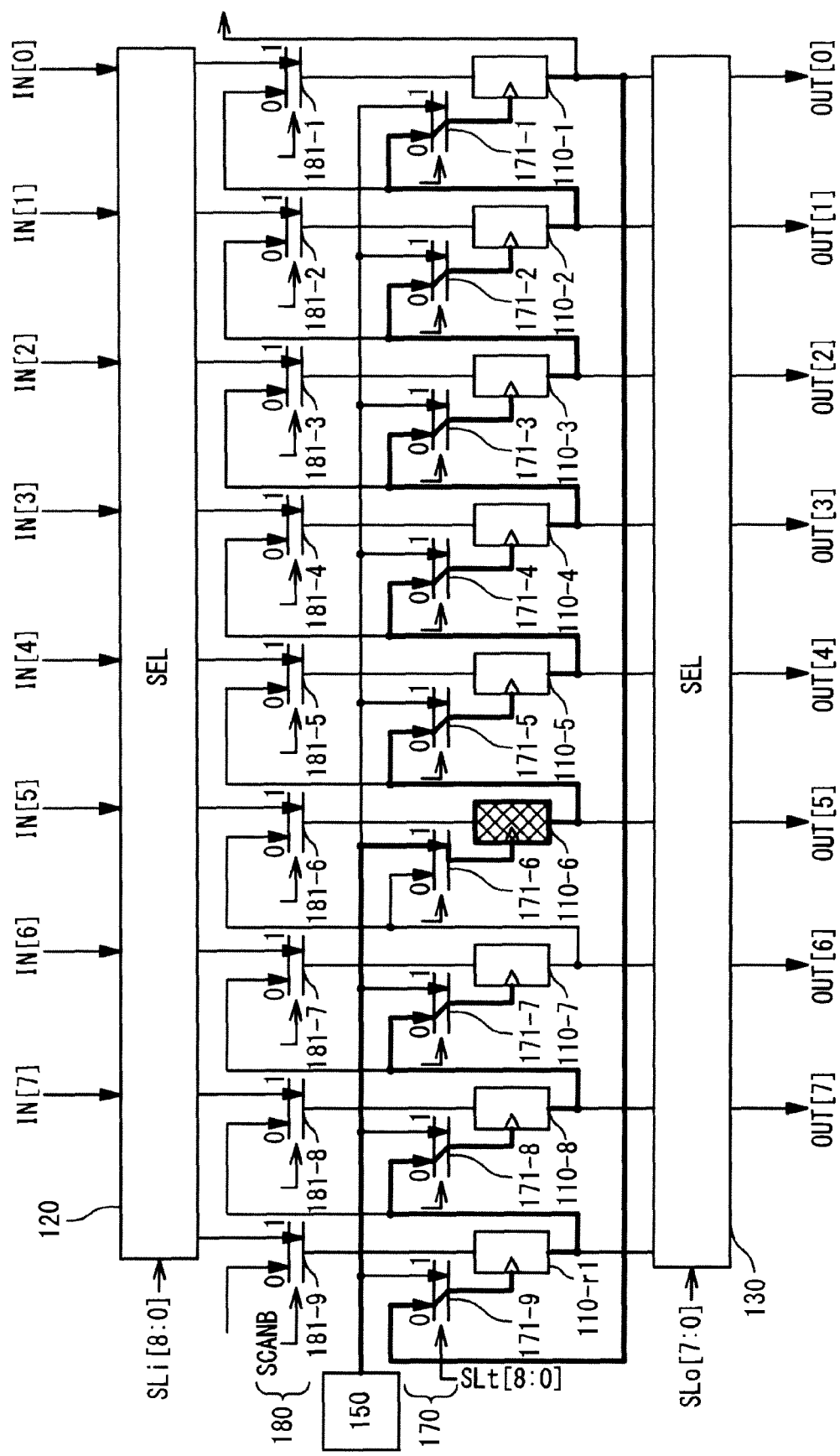
FIG. 25 shows data flow at a test mode in the case of the modification example.

FIG. 25 shows data flow at the test mode. As an example, let us consider a case where the flip-flop 110-6 is the target flip-flop. The clock select signal SLt[5]="1" is input to the clock selector 171-6. In this case, the clock selector 171-6 selects the signal from the mode control circuit 150 and outputs it to the clock input terminal of the target flip-flop 110-6. As a result, the target flip-flop 110-6 performs the toggle operation or the self-oscillation operation.

The clock select signal SLt="0" is input to the clock selectors 171 other than the clock selector 171-6. As a result, the clock selector 171-m (m=1 to 5, 7 to 8) selects the output signal from the upper-bit side flip-flop 110-(m+1) and outputs it to the clock input terminal of the flip-flop 110-m. Also, the clock selector 171-9 selects the output signal from the flip-flop 110-1 and outputs it to the clock input terminal of the redundant flip-flop 110-r1.

In this manner, at the test mode, the plurality of flip-flops 110 are serially connected following the target flip-flop 110-6 performing the toggle operation or the self-oscillation operation as a head. Then, the output data from the previous-stage flip-flop is input to the clock input terminal of each of the flip-flops 110 other than the target flip-flop 110-6. Therefore, the flip-flops 110 other than the target flip-flop 110-6 functions as a binary counter.

Figure 26:
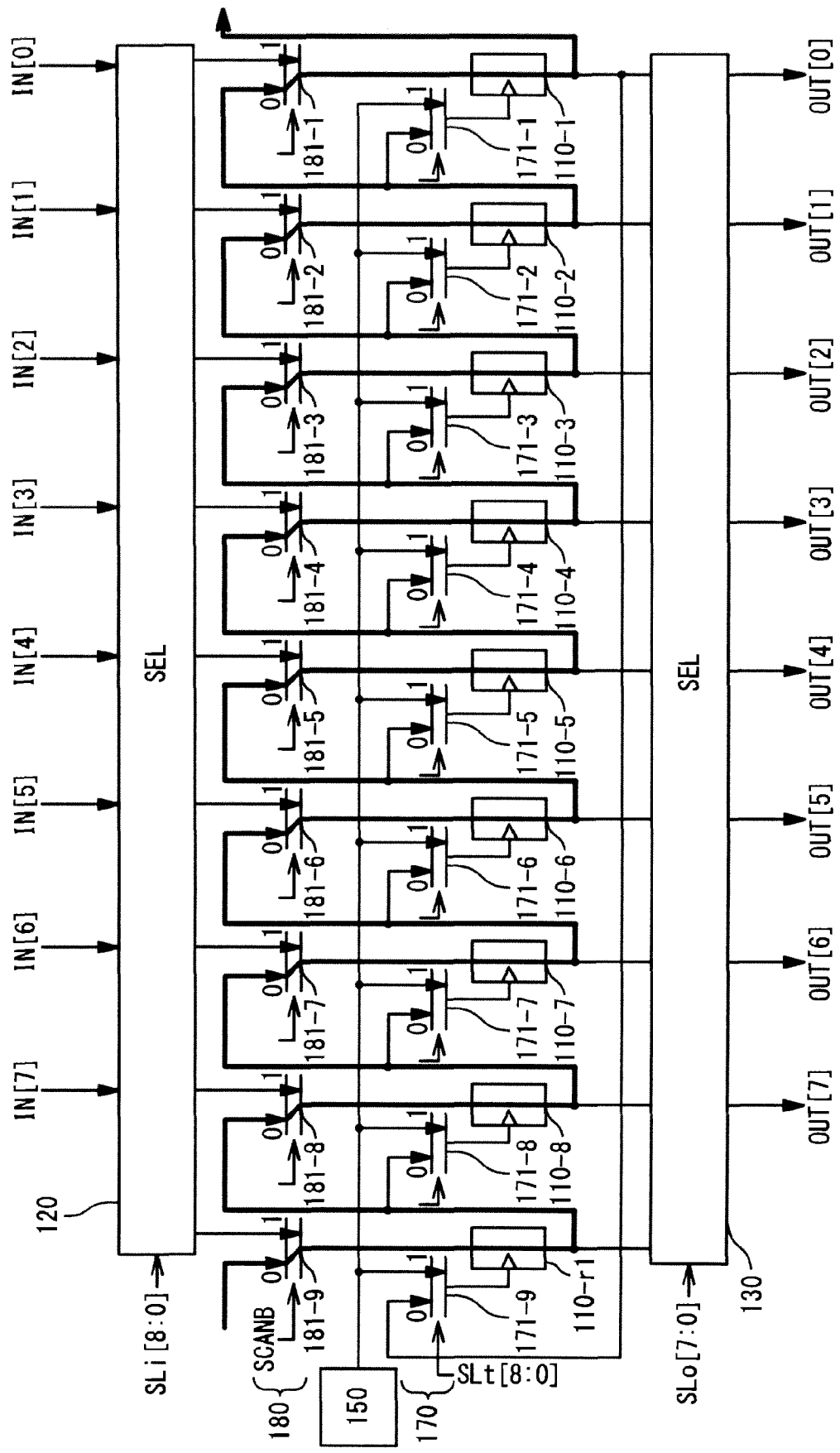
FIG. 26 shows data flow in the case of the modification example.

For example, the count value (count signal CNT) counted by the binary counter is output as the output data OUT[7:0] through the output selector section 130. Alternatively, the count value (count signal CNT) may be output to the outside through the scan chain as shown in FIG. 26. It should be noted that at the scanning, the operation mode of each flip-flop 110 is set to the usual FF mode.

Note that it is possible to set the plurality of flip-flops 110 one by one as the target flip-flop by shifting the bit "1" in the clock select signals SLt[8:0] in turn.

According to the present modification example, as described above, the flip-flops 110 other than the target flip-flop are used as the counter. In another word, the plurality of flip-flops 110 are utilized effectively. Since there is no need to provide the counter 160 separately, a circuit area is reduced, which is preferable.

2-4. Power-Supply Voltage Adaptive Control System

The semiconductor integrated circuit according to the present embodiment is preferably applied to an "extremely low power circuit". With respect to the extremely low power circuit, it is required to set an operation voltage VDD as low as possible. Hereinafter, a "power-supply voltage adaptive control system" that appropriately controls the operation voltage VDD will be described.

Figure 27:
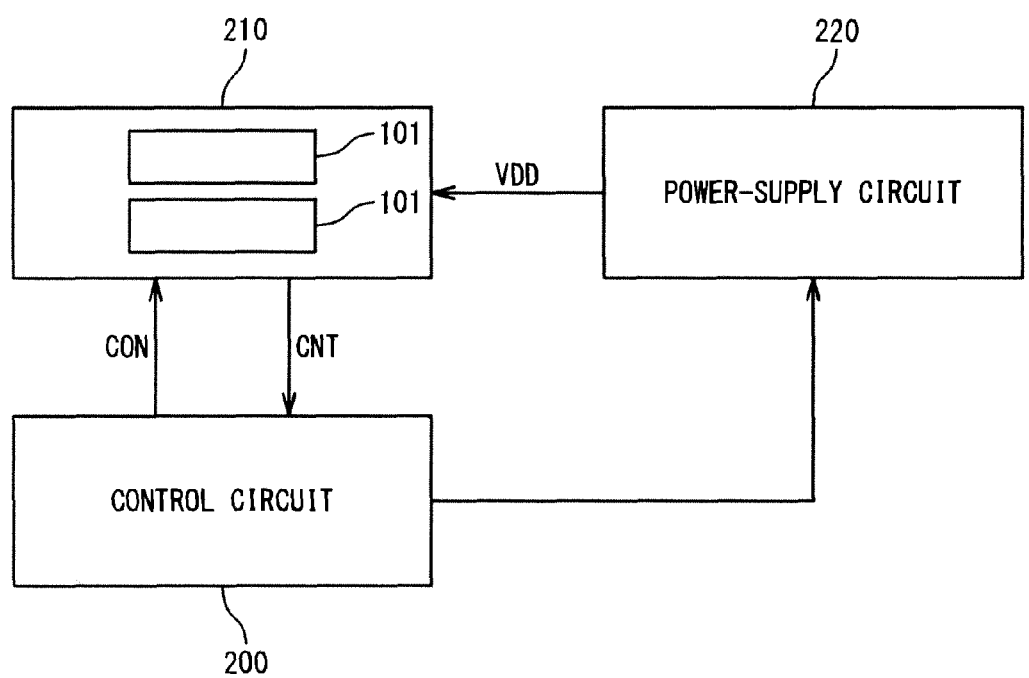
FIG. 27 is a block diagram showing a configuration of a power-supply voltage adaptive control system according to the second embodiment of the present invention.

FIG. 27 is a block diagram showing a configuration of the power-supply voltage adaptive control system according to the present embodiment. The power-supply voltage adaptive control system has a control device 200, a target circuit 210 and a power-supply circuit 220. The target circuit 210 is a semiconductor integrated circuit as a voltage-control target and has the above-described multi-bit register section 101. The power-supply circuit 220 at least supplies the operation voltage VDD of the flip-flops 110 to the multi-bit register section 101. The control device 200 is connected to the target circuit 210 and the power-supply circuit 220 and controls operations of them.

The adaptive control method for the operation voltage VDD is as follows. Let us consider a case where the operation voltage VDD supplied by the power-supply circuit 220 is initially set to an extremely low voltage (for example, 0.5 V or less). First, the control device 200 outputs the control signal CON to the target circuit 210 to have it execute the AC characteristics test. The multi-bit register section 101 outputs the count signal CNT to the control device 200. The control device 200 generates the reconfiguration information RECON based on the received count signal CNT and transmits the reconfiguration information RECON to the target circuit 210. In the target circuit 210, the reconfiguration processing is performed based on the latest reconfiguration information RECON.

It should be noted that there may be a case where any error flip-flop still remains even when all the redundant flip-flops 110-r1 to 110-rR are used. In this case, the extremely low voltage which causes the AC characteristics error is slightly loosened up. For that purpose, the control device 200 instructs the power-supply circuit 220 to increase the operation voltage VDD slightly. After that, the AC characteristics test is performed again.

In this manner, according to the present embodiment, the operation voltage VDD is slightly increased if any error flip-flop still remains even when all the redundant flip-flops 110-r1 to 110-rR are used. It is thus possible to set the operation voltage VDD as low as possible with eliminating the error flip-flop. As a result, the power consumption is suppressed to a minimum necessary level.

After the error flip-flop is excluded, adaptive control of the power-supply voltage or the substrate bias may be performed based on path delay. A better result is expected to be obtained, because the error flip-flop whose AC characteristics are deteriorated is exclude.

It should be noted that the second embodiment of the present invention may be described as follows.

(Claim 1)
A semiconductor integrated circuit comprising:
a plurality of flip-flops; and
a counter,
wherein each of said plurality of flip-flops comprises a feedback path from its own output to input and is configured to perform a toggle operation or a self-oscillation operation by using said feedback path at a test mode, and
wherein at said test mode, said counter receives an output data from said each flip-flop performing said toggle operation or said self-oscillation operation and performs counting with regard to said output data for a predetermined period of time.

(Claim 2)
The semiconductor integrated circuit according to claim 1, further comprising:
N input terminals, wherein N is an integer equal to or more than 1;
N output terminals; and
a selector section,
wherein said plurality of flip-flops include N flip-flops and R redundant flip-flops, wherein R is an integer equal to or more than 1, and
wherein said selector section selects N selected flip-flops from said plurality of flip-flops depending on reconfiguration information and switches data flow such that data input to said N input terminals are respectively output to said N output terminals by said N selected flip-flops.

(Claim 3)
The semiconductor integrated circuit according to claim 2, wherein a flip-flop whose number of toggle times in said predetermined period of time or whose self-oscillation frequency is less than a predetermined value is an error flip-flop,
wherein said error flip-flop is detected based on a count value obtained by said counter at said test mode, and
wherein said reconfiguration information is generated such that said detected error flip-flop is excluded from said N selected flip-flops.

(Claim 4)
The semiconductor integrated circuit according to claim 3, wherein said reconfiguration information is output to said selector section at a predetermined timing after said test mode is ended.

(Claim 5)
The semiconductor integrated circuit according to any one of claims 1 to 4,
wherein each of said plurality of flip-flops comprises:
an input node;
a first latch circuit;
a first switch circuit provided between said input node and said first latch circuit;
a second latch circuit;
a second switch circuit provided between said first latch circuit and said second latch circuit;
an output node connected to an output of said second latch circuit; and
said feedback path from said output node to said input node which is activated at said test mode,
wherein at said toggle operation, said first switch circuit and said second switch circuit are alternately turned ON, and
wherein at said self-oscillation operation, said first switch circuit and said second switch circuit both are maintained at ON state.

(Claim 6)
The semiconductor integrated circuit according to any one of claims 1 to 5, further comprising a count-target selector,
wherein at said test mode, said count-target selector selects a target flip-flop one by one from said plurality of flip-flops and outputs said output data output from said target flip-flop to said counter.

(Claim 7)
The semiconductor integrated circuit according to any one of claims 1 to 5,
wherein at said test mode, a target flip-flop as a target of the counting is selected one by one from said plurality of flip-flops, and flip-flops other than said target flip-flop among said plurality of flip-flops function as said counter.

(Claim 8)

The semiconductor integrated circuit according to claim 7, wherein at said test mode, said plurality of flip-flops are serially connected following said target flip-flop as a head, said target flip-flop performs said toggle operation or said self-oscillation operation, and the output data is input to a clock input terminal of each of said flip-flops other than said target flip-flop from a flip-flop at the previous stage.

(Claim 9)

A power-supply voltage adaptive control system comprising:

the semiconductor integrated circuit according to any one of claims 1 to 8;

a power-supply circuit configured to supply an operation voltage of said plurality of flip-flops; and a control device configured to control operations of said semiconductor integrated circuit and said power-supply circuit, wherein if said error flip-flop still remains even when said R redundant flip-flops are used, said control device instructs said power-supply circuit to increase said operation voltage.

3. Third Embodiment

A third embodiment of the present invention is a combination of the above-described first embodiment and second embodiment. FIG. 28 is a flow chart showing processing in the third embodiment. First, the DC error detection and the reconfiguration are performed as described in the first embodiment (Step S100). If all the redundant FFs are used as a result of the Step S100 (Step S150; No), the process ends. On the other hand, if there exists any line having spare redundant FF even after the Step S100 (Step S150; Yes), the AC characteristics error detection and the reconfiguration are performed with respect to the said line as described in the second embodiment (Step S200). Since an occurrence frequency of the DC error is expected to be low, the redundant FFs can be utilized effectively.

While the exemplary embodiments of the present invention have been described above with reference to the attached drawings, the present invention is not limited to these exemplary embodiments and can be modified as appropriate by those skilled in the art without departing from the spirit and scope of the present invention.

What is claimed is:

1. A semiconductor integrated circuit comprising:

N input terminals, wherein N is an integer equal to or more than 1;

N output terminals;

a plurality of flip-flops including N flip-flops and R redundant flip-flops, wherein R is an integer equal to or more than 1;

a selector section configured to select N selected flip-flops from said plurality of flip-flops depending on reconfiguration information and to switch data flow such that data input to said N input terminals are respectively output to said N output terminals by said N selected flip-flops; and an error detection section configured to generate said reconfiguration information at a test mode, wherein at said test mode, said N flip-flops form a scan chain and a scan data is input to said scan chain, wherein a flip-flop whose output is fixed to 0 or 1 is an error flip-flop, and wherein said error detection section detects said error flip-flop included in said N flip-flops based on scan input data respectively input to said N flip-flops and scan output data respectively output from said N flip-flops at said test mode and further generates said reconfiguration information excluding said detected error flip-flop from said N selected flip-flops.

2. The semiconductor integrated circuit according to claim 1, wherein said error detection section comprises a memory section in which said reconfiguration information generated is stored, and wherein at a predetermined timing after said test mode is ended, said reconfiguration information stored in said memory section is output to said selector section.

3. The semiconductor integrated circuit according to claim 2, wherein said memory section is a latch circuit.

4. The semiconductor integrated circuit according to claim 1, wherein said error detection section comprises N XNOR circuits, wherein said scan input data respectively input to said N flip-flops and said scan output data respectively output from said N flip-flops are respectively input to input terminals of said N XNOR circuits, and wherein 0 and 1 are alternately input as said scan data to said scan chain.

* * * * *